United States Patent
Afshari et al.

(10) Patent No.: US 9,874,774 B2
(45) Date of Patent: Jan. 23, 2018

(54) METHOD AND APPARATUS FOR TESTING OPERATION OF AN OPTICAL LIQUID CRYSTAL DEVICE

(71) Applicant: LensVector Inc., Sunnyvale, CA (US)

(72) Inventors: Bahram Afshari, Los Altos, CA (US); Karen Asatryan, Quebec (CA); Peter P Clark, Boxborough, MA (US); Tigran Galstian, Quebec (CA); Michael J. Nystrom, San Jose, CA (US); Vladimir Presniakov, Quebec (CA); Sergei Yakovenko, Pleasanton, CA (US); Armen Zohrabyan, Quebec (CA)

(73) Assignee: LENSVECTOR INC., Sunnyvale, CA (US)

(*) Notice: Subject to any disclaimer, the term of this patent is extended or adjusted under 35 U.S.C. 154(b) by 371 days.

(21) Appl. No.: 14/817,275

(22) Filed: Aug. 4, 2015

(65) Prior Publication Data
US 2015/0346524 A1    Dec. 3, 2015

Related U.S. Application Data

(63) Continuation of application No. 13/504,529, filed as application No. PCT/CA2010/001684 on Oct. 27, 2010, now Pat. No. 9,140,920.
(Continued)

(51) Int. Cl.
*G02F 1/13*        (2006.01)
*G02F 1/1333*    (2006.01)
(Continued)

(52) U.S. Cl.
CPC ....... *G02F 1/133351* (2013.01); *G01R 1/071* (2013.01); *G02F 1/1309* (2013.01);
(Continued)

(58) Field of Classification Search
CPC . G02F 1/133351; G02F 1/1309; G01R 1/071; G09G 3/006; Y10T 29/49002; Y10T 29/49117; Y10T 29/49771
See application file for complete search history.

(56) References Cited

U.S. PATENT DOCUMENTS 3,913,072 A    10/1975   Ivor
3,934,199 A    1/1976   Channin
(Continued)

FOREIGN PATENT DOCUMENTS

CA WO2009 15376412-2009    * 12/2009
WO    0201280 A    1/2002
(Continued)

OTHER PUBLICATIONS

Gary Steinbrueck et al., Non-Contact, Pad-less Measurement Technology and Test Structures for Characterization of Cross-Wafer and In-Die Product Variability, ICMTS 2009 IEEE International Conference, Proceeding Articles, Microelectronic Test structures, pp. 91-95, Mar. 30, 2009.
(Continued)

*Primary Examiner* — Yasser A Abdelaziez
(74) *Attorney, Agent, or Firm* — J-TEK LAW PLLC; Jeffrey D. Tekanic; Scott T. Wakeman

(57) ABSTRACT

Methods and apparatus for testing operation of a single or multiple tunable active optical device(s) operated by one or more driving electrodes are described. Test methods and apparatus are provided for device testing without necessarily requiring direct physical contact with the driving electrodes. Testing subjects devices to incident light along an optical path and to an external electric field applied to the device producing a dipolar charge distribution within the electrodes, causing the device to operate. The effect of device operation on incident light is optically sensed. The sensed effect is analyzed to identify device defects. Test methods
(Continued)

and apparatus are provided for testing multiple unsingulated devices during fabrication employing a strip contact structure having contact strips connected to multiple devices and extending to wafer edges, such that singulating devices leaves portions of the strip contact structure exposed on device dice edges providing electrical contacts in use.

14 Claims, 43 Drawing Sheets

Related U.S. Application Data

(60) Provisional application No. 61/298,237, filed on Jan. 26, 2010, provisional application No. 61/255,200, filed on Oct. 27, 2009.

(51) Int. Cl.
*G01R 1/07* (2006.01)
*G09G 3/00* (2006.01)

(52) U.S. Cl.
CPC ........ *G09G 3/006* (2013.01); *Y10T 29/49002* (2015.01); *Y10T 29/49117* (2015.01); *Y10T 29/49771* (2015.01)

(56) References Cited

U.S. PATENT DOCUMENTS

| | | | |
|---|---|---|---|
| 4,956,602 A | 9/1990 | Parrish | |
| 4,983,911 A | 1/1991 | Henley | |
| 5,389,556 A | 2/1995 | Rostoker et al. | |
| 5,406,213 A * | 4/1995 | Henley | G02F 1/1309 324/760.01 |
| 5,969,538 A | 10/1999 | Whetsel | |
| 6,177,968 B1 * | 1/2001 | Okada | G02F 1/134336 349/143 |
| 6,562,640 B1 | 5/2003 | Tseng et al. | |
| 6,627,917 B1 | 9/2003 | Fenner et al. | |
| 6,650,138 B2 | 11/2003 | Zuravleff | |
| 6,750,926 B2 | 6/2004 | Ohgiichi et al. | |
| 6,750,939 B2 | 6/2004 | Sojourner et al. | |
| 6,809,337 B2 | 10/2004 | Winer | |
| 6,890,786 B2 | 5/2005 | Walker et al. | |
| 6,891,592 B2 | 5/2005 | Magana et al. | |
| 7,295,375 B2 | 11/2007 | Jacobowitz et al. | |
| 7,329,861 B2 | 2/2008 | Ma et al. | |
| 7,692,757 B2 | 4/2010 | Magana | |
| 7,772,869 B2 | 8/2010 | Lee et al. | |
| 7,796,222 B2 | 9/2010 | Kimura et al. | |
| 2004/0017537 A1 | 1/2004 | Magana et al. | |
| 2004/0105048 A1 | 6/2004 | Kyu et al. | |
| 2007/0229754 A1 | 10/2007 | Galstian et al. | |
| 2009/0213321 A1 | 8/2009 | Galstian et al. | |
| 2009/0316097 A1 | 12/2009 | Presniakov et al. | |
| 2010/0007807 A1 | 1/2010 | Galstian et al. | |
| 2010/0085326 A1 * | 4/2010 | Anno | G06F 3/044 345/174 |
| 2011/0181797 A1 | 7/2011 | Galstian et al. | |
| 2012/0019761 A1 | 1/2012 | Nystrom et al. | |

FOREIGN PATENT DOCUMENTS

| | | |
|---|---|---|
| WO | 2007098602 A1 | 9/2007 |
| WO | 2009146529 A1 | 12/2009 |
| WO | 2009153764 A2 | 12/2009 |
| WO | 2010022503 A1 | 3/2010 |

OTHER PUBLICATIONS

H. T. Dai et al., a negative-positive tunable liquid-crystal microlens array by printing, Optics Express, vol. 17 Issue 6 pp. 4317-4323, Optical society of America.

* cited by examiner

METHOD AND APPARATUS FOR TESTING OPERATION OF AN OPTICAL LIQUID CRYSTAL DEVICE

This application is a continuation of U.S. patent application Ser. No. 13/504,529, filed Sep. 17, 2012, which is a 35 U.S.C. 371 National Stage of International Application Ser. No. PCT/CA2010/01684 filed Oct. 27, 2010, claiming priority of U.S. Provisional Application Ser. No. 61/298,237, filed Jan. 26, 2010 and to U.S. Provisional Application Ser. No. 61/255,200, filed Oct. 27, 2009, which are incorporated herein by reference in their entirety.

TECHNICAL FIELD

The present invention relates to the field of electro-optical device testing, and more particularly to methods and apparatus for wafer level testing operation of electro-optical liquid crystal (LC) devices prior to singulation, and to manufacturing of electro-optical liquid crystal (LC) devices.

BACKGROUND

Electro-optical devices based on Liquid Crystals (LC) make use of variable properties of LCs upon absence or presence of an electric field to control their optical operation, typically by selectively allowing (by becoming transparent) or preventing (by becoming opaque) incident light transmission such as in the case of LC cells used in display (LCD) devices, or by changing their refractive properties such as in the case of LC cells used as Tunable-focus LC Lens (TLCL) devices. TLCLs are manufactured employing wafer fabrication as cells (dies) on wafers.

During mass manufacturing processes of such electro-optical devices, defects are likely to be induced (develop) on some of these devices (dies prior to singulation), which could adversely affect their operation when in use (after singulation). As part of quality control procedures, all or at least representative samples of the fabricated devices (dies) are being subjected to optical (functional) testing to ensure proper operation prior to making them available for end use.

Turning to FIGS. 1a and 1b, there is schematically illustrated a typical known arrangement designated at 10 for testing a single electro-optical device (after singulation). Liquid crystal cell 12 has first and second planar driving electrodes (layers) 14, 16 provided on first and second transparent glass substrates 18, 20 and being disposed in a predetermined spatial relationship with respect to one another. Planar driving electrode layers 14, 16 are delicate, in the order of microns thick. For testing purposes, a prior art technique includes mechanically placing test probes on each driving electrode 14, 16 associated with each individual LC cell die. Driving electrodes 14, 16 are connected to output terminals 22, 22' of an external electrical voltage source 24, an electrical arrangement 10 including first and second testing electrodes (probes) 26, 28 connected to electrical voltage source 24 through respective external lines 27, 29 and connectors 30, 30' directly making physical electrical contact with driving electrode (layers) 14, 16, respectively. Upon application of a (driving) voltage of a predetermined value across driving electrodes 14, 16, the LC cell 12 is caused to operate by changing its light transmission or refractive properties in accordance with the electrical field generated (applied), whose intensity can be expressed by the well-known capacitance relation:

$$E = V_{LC}/d$$

wherein $V_{LC}$ is the voltage value applied across the LC cell and d is the distance separating the driving electrodes (layers) 14, 16 of the LC cell. An induced optical property change can be sensed through the use of an appropriate optical analyzer, allowing identification of any defective portion of the liquid crystal device.

Turning now to FIGS. 2a and 2b, there is schematically illustrated a typical known arrangement 10" which is similar to the arrangement 10 described above in view of FIGS. 1a and 1b, wherein the electro-optical device under test is a single TLCL including one or more optional dielectric layers 32, such as field modulating hidden layers, weakly conductive layers or supporting substrates for optically active layers.

Such a prior art technique requires the fabrication such an LC optical device to have progressed to an advanced state past singulation or is applicable to low yield singly fabricated LC optical devices. Moreover, the required physical contact with the delicate micron thick driving electrode layers 14, 16 is inefficient. It can be appreciated, in view of the foregoing examples, that the known testing technique according to the prior art makes use of testing electrodes directly making physical, electrical contact with delicate driving electrode layers in order to apply the desired voltage to the electro-optical device under test exposing such TLCL devices to potential damage such as scratching during testing. To be applicable, such technique requires the availability of direct contact locations on the substrates, which must be externally accessible and not hidden for testing during manufacture. Whenever, a single electro-optical device 12', or a multiple electro-optical device unit 11', such as illustrated in FIG. 3 does not provide such externally accessible electrical contact locations connected to respective driving electrodes, operational testing prior to singulation employing the presently known technique exhibits an important limitation which renders such testing a very difficult task, if not infeasible.

Referring now to FIG. 4 there is shown another prior art arrangement 10' based on the same known principle, for testing in parallel the performance of a multiple electro-optical device unit 11, such as a wafer, formed of first and second substrates 18', 20' and including a two-dimensional array of electro-optical devices such as LC cells 12' built in the wafer. It is appreciated that driving electrodes layers 14', 16' have an extent limited to single LC cells 12'. An grid of "scribe line" (kerf) areas extends between adjacent LC optical device dies 12' containing a network lines 27', 29' for evaluating the fabrication process. For parallel test purposes, a plurality of line pairs 27', 29', each connected to driving electrodes 14', 16' of a single LC cell 12', are connected to output terminals 22, 22' of external electrical voltage source 24. A plurality of pairs of first and second test electrodes 26, 28, connected to electrical voltage source 24 through external lines 27, 29, are used to make direct physical contact via connectors 30, 30' with respective network lines 27', 29' and indirectly to make electrical contact with driving electrodes 14', 16'.

For example, unpublished U.S. patent application Ser. No. 07/933,325, filed Aug. 21, 1992 by Rostoker, et al., entitled "Methods For Die Burn-In", serving as parent for U.S. continuation application Ser. No. 08/370,565 of same title issued as U.S. Pat. No. 5,489,538 on Feb. 6, 1996, describes such a technique for burning-in semiconductor circuit chips, as opposed to liquid crystal optical device dies, prior to dicing (on the wafer) in accordance with which a common network of power and ground conductors in the scribe lines are provided. The power and ground lines connect to all dies on a wafer. The power and ground lines simply power up all devices for static burn-in. Built-in semiconductor circuit chip self test (self-starting, signal-generating) circuitry on each die provides signals on power up to exercise some of the functionality of the chip.

Similarly, U.S. Pat. No. 5,389,556 entitled "Individually Powering-Up Unsingulated Dies On A Wafer" issued Feb. 14, 1995 to Rostoker, et al. describes testing a multitude of unsingulated semiconductor circuit chips (dies) on a wafer by individually powered up using various "electronic mechanisms" on the wafer, and connecting the electronic mechanisms to the individual dies by conductive lines on the wafer. Rostoker '556 proposes placing a number of conductors in the scribe line areas on a wafer, including: at least one power line and at least one ground line for powering up the dies for testing; a multitude of probe lines and a multitude of sense lines for implementing a cross-check type testing methodology; and preferably, redundant power and ground lines, to provide coverage in the event of an open line.

As is well known in the art, scribe lines areas, and anything contained within them, will be destroyed when the dies are singulated from the wafer. Such networks of power lines, sense lines, probe lines and conductors are therefore sacrificial.

In the wafer fabrication field there is a pressure to maximize the useful or productive area of a wafer to increase yield and reduce production costs which dictates that scribe line area be kept as small as possible. Dies are desired to be laid out on a wafer in a pattern that is packed as tightly as possible. Desirable scribe line widths include only those large enough to ensure that the dies can be separated without damage to the device area of the dies.

SUMMARY

It is an object of the proposed solution to provide a method and apparatus for operationally testing a multitude of unsingulated tunable active optical devices during fabrication and prior to singulation, which method and apparatus employ a reduced number of reusable physical contacts for testing multiple tunable active optical devices without additional sacrificial wafer level components such as conductor networks, traces, contacts, pads.

In accordance with another broad aspect of the proposed solution, a contact structure is employed in order to provide electrical contact with driving electrodes over relatively large areas of an electrode layer for testing purposes during wafer fabrication. Preferably strip contact structures are fabricated across multiple tunable active optical device elements on wafers. For example strip contact structures are fabricated across scribe lines during wafer fabrication of multiple electro-optical liquid crystal devices to provide a reduced number of test electrode contact points on wafer edges. For example a number of deposited metallic strips provides less than one test electrode pair of contacts per unsingulated element (without multiplexing circuitry). The deposition of metallic strips across scribe lines permits high die density wafer fabrication without limiting the thinness of the scribe lines. Advantageously, despite fabricating the metallic strips across scribe lines to enable operational testing during wafer fabrication, such strip contact structure is not sacrificed as post singulation metallic strip contact portions remaining in the tunable active optical device element layered structures are employed to provide electrical contact during tunable active optical device operation.

In accordance with an aspect of the proposed solution there is provided a method of manufacturing on a wafer a tunable active optical element using wafer scale techniques, the method comprising: providing a wafer of an array of cells, each cell including a tunable active optical element; driving said elements while on said wafer to perform a test of said element during wafer fabrication to determine operability; designating a first group of elements as operational based on said test; singulating at least one cell from the wafer based on the identified group of operational elements; and rejecting a second group of elements based on the test.

In accordance with another aspect of the proposed solution there is provided a method of manufacturing on a wafer a tunable active optical element using wafer scale techniques, the method comprising: providing a wafer of an array of cells, each cell including a tunable active optical element; driving said elements while on said wafer to perform a test of said element during wafer fabrication to determine operability; designating a first group of elements as operational based on said test; singulating at least one cell from the wafer based on the identified group of operational elements; and rejecting a second group of elements based on the test, the method further comprising: subjecting a liquid crystal device including said tunable active optical element having said first electrode layer for operating said liquid crystal device to incident light along an optical path of said device; applying to said liquid crystal device an external electric field to produce a dipolar charge distribution within said first electrode layer, causing operation of said liquid crystal device; and optically sensing an effect of said liquid crystal device operation on said incident light being tested.

In accordance with a further aspect of the proposed solution there is provided a tunable active optical element as made employing one of the methods of manufacture herein immediately above, said tunable active optical element defining an optical aperture and having a layered structure, said element comprising: a first film electrode formed on a surface of a first substrate and covered by a second substrate; and a strip contact structure filling a volume within said layered structure and contacting said film electrode, said strip contact structure being located outside of said optical aperture and providing an electrical connection surface much larger than a thickness of said film electrode, said element having a peripheral edge surface with exposed layer edges of said layered structure, said strip contact structure being located at or near an edge of said element.

It is another object of the present proposed solution to provide a method and apparatus for testing operation of at least one electro-optical liquid crystal device having at least one driving electrode for operating the device during fabrication and prior to singulation, which method and apparatus do not necessarily require direct physical contact with the driving electrode to perform operational testing.

According to the above object, from a broad aspect, there is provided a method for testing operation of at least one electro-optical liquid crystal device having at least one driving electrode for operating said device, the method comprising: subjecting said liquid crystal device to incident light along an optical path of said device; applying to said liquid crystal device an external electric field to produce a dipolar charge distribution within said electrode, causing operation of said liquid crystal device; and optically sensing an effect of said liquid crystal operation on said incident light.

In accordance with the aspect, there is also provided a method wherein said at least one electro-optical liquid crystal device is included in a multiple unit further including a plurality of such electro-optical devices being tested in parallel using said method.

In accordance with the aspect, there is also provided a method wherein said optical liquid crystal device is a tunable-focus liquid crystal lens.

In accordance with the aspect, there is further provided a method wherein said optical liquid crystal device is a liquid crystal display cell.

In accordance with the aspect, there is further provided a method wherein applying said external electric field includes applying a predetermined voltage value to at least one testing electrode disposed in a predetermined spatial relationship with said driving electrode to generate said external electric field.

In accordance with the aspect, there is further provided a method further comprising analyzing the sensed optical effect to identify any defective portion of said liquid crystal device.

In accordance with the aspect, there is further provided a method wherein said optical liquid crystal device is a tunable-focusing liquid crystal lens.

In accordance with the aspect, there is yet further provided a method wherein said optical liquid crystal device is a liquid crystal display cell.

According to the above object, from another broad aspect, there is provided an apparatus for testing operation of at least one electro-optical liquid crystal device having at least one driving electrode for operating said device, said apparatus comprising: a light source for directing incident light toward said device substantially along an optical axis thereof; an electrical arrangement for applying to said liquid crystal device an external electric field to produce a dipolar charge distribution within said electrode, causing operation of said liquid crystal device; and an optical sensor responsive to an effect of said liquid crystal operation on said incident light.

In accordance with the aspect, there is further provided an apparatus wherein said at least one electro-optical liquid crystal device is included in a multiple unit further including a plurality of such electro-optical devices being tested in parallel using said apparatus.

In accordance with the aspect, there is further provided an apparatus wherein said optical liquid crystal device is a tunable-focusing liquid crystal lens.

In accordance with the aspect, there is further provided an apparatus wherein said optical liquid crystal device is a liquid crystal display cell.

In accordance with the aspect, there is further provided an apparatus further comprising a data processor for analyzing the sensor response to identify any defective portion of said liquid crystal device.

In accordance with the aspect, there is further provided an apparatus wherein said electrical arrangement includes at least one testing electrode connected to an electrical voltage source.

In accordance with the aspect, there is further provided an apparatus wherein said testing electrode is provided on a substrate adapted to be disposed in a predetermined spaced relationship with said driving electrode to generate said external electric field at a predetermined voltage value.

In accordance with the aspect, there is further provided an apparatus wherein said testing electrode is substantially planar and made of an optically transparent material.

In accordance with the aspect, there is further provided an apparatus wherein said substrate is made of an optically transparent material.

In accordance with the aspect, there is further provided an apparatus wherein said device has first and second opposed planar surfaces extending transversely with respect to said optical path, said incident light being directed through one of said first and second surfaces, and said optical effect being sensed from the other one said surfaces.

In accordance with the aspect, there is further provided an apparatus wherein said device has first and second opposed planar surfaces extending transversely with respect to said optical path, said apparatus further comprising an optical reflecting layer disposed adjacent to one of said first and second surfaces, said incident light being directed through the other one of said surfaces, and said optical effect being sensed following reflection thereof on said layer from said adjacent surface through said other surface.

In accordance with the aspect, there is further provided an apparatus wherein said device has first and second driving electrodes disposed in a predetermined spatial relationship with one another, said electrical arrangement including first and second testing electrodes connected to an electrical voltage source.

In accordance with the aspect, there is further provided an apparatus wherein said first testing electrode is provided on a first substrate adapted to be disposed in a predetermined spaced relationship with said first driving electrode, said second testing electrode is provided on a second substrate adapted to be disposed in a predetermined spaced relationship with said second driving electrode, to generate said external electric field at a predetermined relative voltage value between said first and second driving electrodes.

In accordance with the aspect, there is further provided an apparatus wherein said testing electrodes are substantially planar and made of an optically transparent material.

In accordance with the aspect, there is further provided an apparatus wherein said substrates are made of an optically transparent material.

In accordance with the aspect, there is further provided an apparatus wherein said device has first and second opposed planar surfaces extending transversely with respect to said optical path, said incident light being directed respectively through one of said first and second substrates and one of said first and second surfaces, and said optical effect being sensed from the other one of said surfaces through the other one of said substrates.

In accordance with the aspect, there is further provided an apparatus wherein said device has first and second opposed planar surfaces extending transversely with respect to said optical path, said apparatus further comprising an optical reflecting layer disposed adjacent to one of said first and second surfaces, said incident light being directed respectively through one of said first and second substrates and the other one of said surfaces, and said optical effect being sensed following reflection thereof on said layer from said adjacent surface through said other surface and said one of said first and second substrates.

According to a further object, there is provided a method of manufacturing an electro-optical device comprising testing operation of at least one electro-optical liquid crystal device having at least one driving electrode for operating said device, the testing method comprising: subjecting said liquid crystal device to incident light along an optical path of said device; applying to said liquid crystal device an external electric field to produce a dipolar charge distribution within the electrode, causing operation of said liquid crystal device; and optically sensing an effect of said liquid crystal operation on said incident light. In some embodiments, the method comprises testing a wafer of such electro-optical liquid crystal devices, singulating the devices from the wafer and releasing as useful devices only those that passed testing.

BRIEF DESCRIPTION OF THE DRAWINGS

The invention will be better understood by way of the following detailed description of embodiments of the proposed solution with reference to the appended drawings, in which:

FIG. 1b is a schematic diagram showing an elevational view of the prior art arrangement of FIG. 1a;

FIG. 2b is another schematic diagram showing an elevational view of the prior art arrangement of FIG. 2a;

DETAILED DESCRIPTION

Figure 1A:
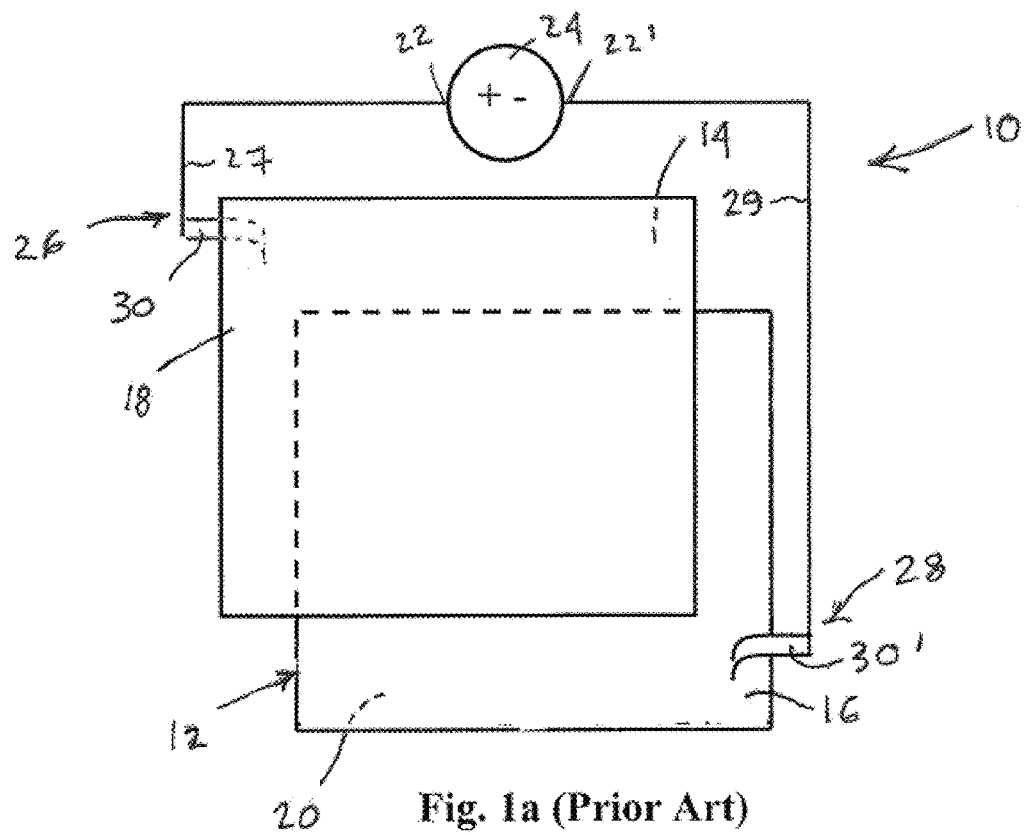
FIG. 1a is a schematic diagram showing a prior art arrangement used for testing operation of a single liquid crystal cell shown in plan view.
Figure 1B:
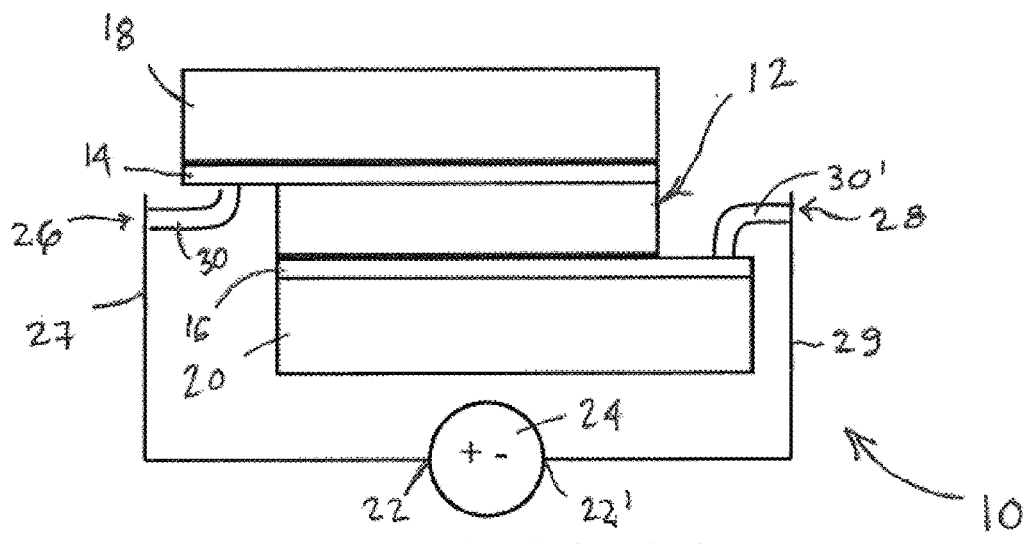
Figure 2A:
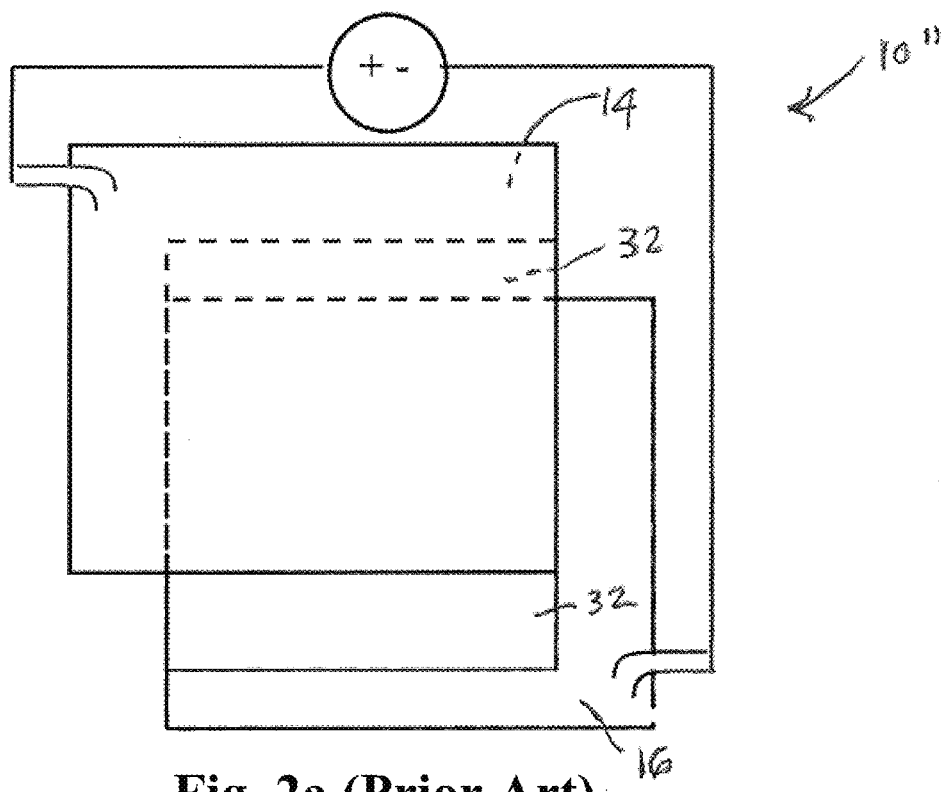
FIG. 2a is a schematic diagram showing another prior art arrangement used for testing operation of a single TLCL provided with an optional dielectric layer and shown in plan view.
Figure 2B:
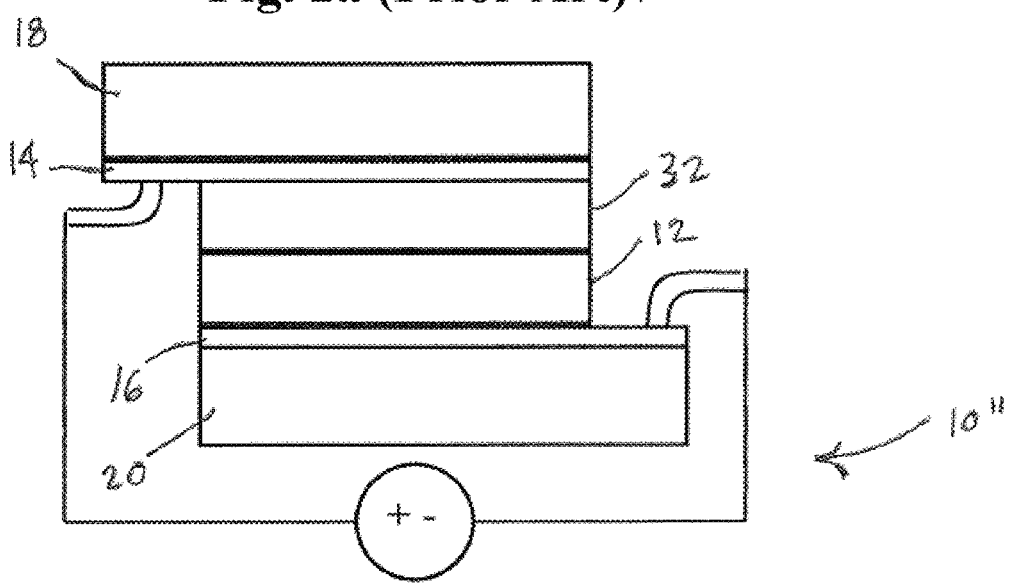
Figure 3:
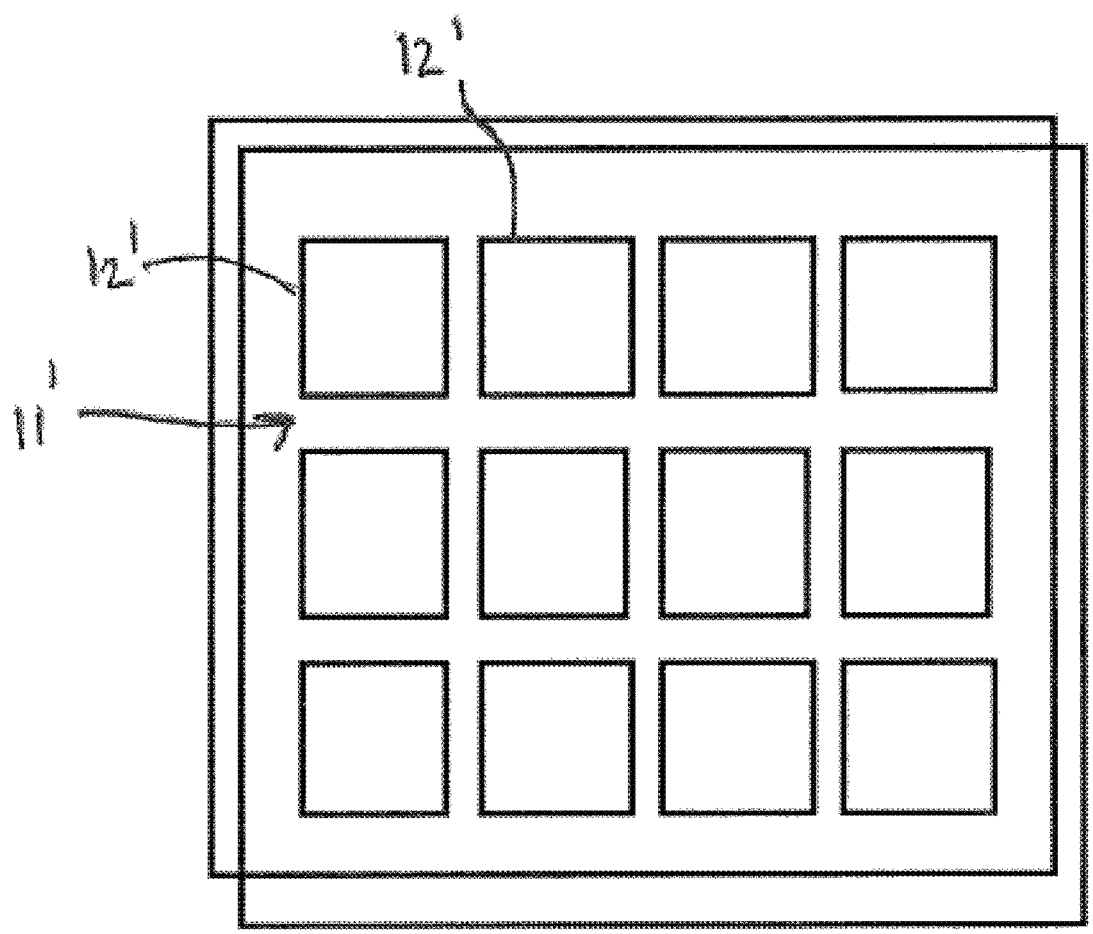
FIG. 3 is a schematic diagram showing another example of multiple electro-optical device unit devoid of available electrical contact locations.
Figure 4:
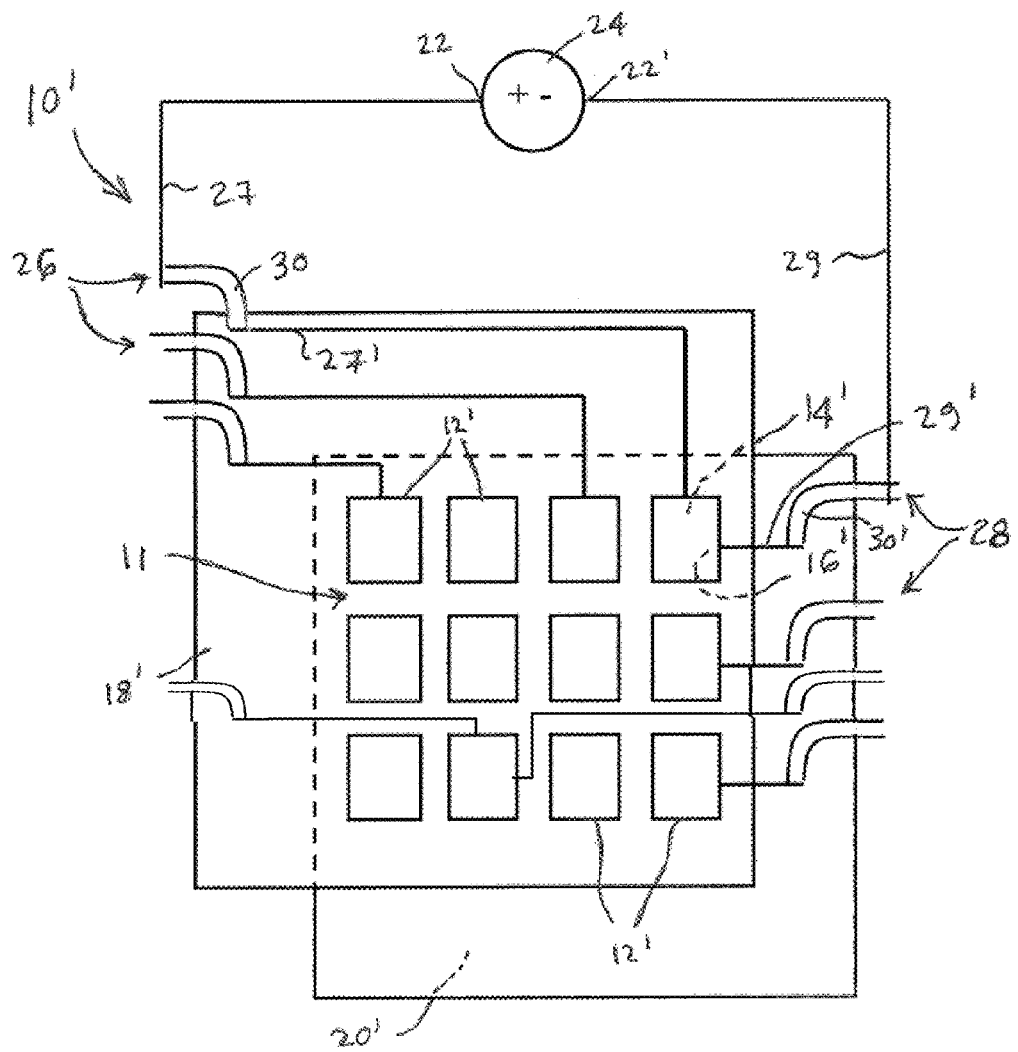
FIG. 4 is another schematic diagram showing another prior art arrangement used for testing the operation of a multiple electro-optical device unit.

It has been discovered that direct physical electrical contact with delicate electro-optical liquid crystal device driving electrodes is both inefficient and prone to introducing further defects. Electrical contact inefficiencies have been encountered stemming from point contacts between test electrodes and the electro-optical liquid crystal device driving electrodes. There are multiple known reasons for electrical contact inefficiencies of point contacts including for example insufficient contact area, uneven driving electrode layer deposition, scratched driving electrode layer due to repeat testing, etc. leading to increased local resistance and therefore to poor electrical contacts.

There is a need to test the operation of electro-optical devices at different stages during fabrication.

Tunable Active Optical Device Wafer Fabrication

A non-limiting example of manufacturing a complete TLCL will now be described. The process starts with bare glass substrates. The glass used for these substrates is typically a borosilicate glass, which is manufactured in very thin thicknesses, 100 microns or less. The glass is cleaned using processes recommended by the glass manufacturer. These include a combination of detergent soaks, ultrasonic cleaning and de-ionized water rinses.

The clean glass is then coated with a transparent conductive thin electrode layer. A typical electrode material is indium tin oxide (ITO) that is sputter deposited on the glass; however, other thin film deposition techniques, such as evaporation, may also be used. In accordance with some implementations, the electrode layer is deposited during wafer fabrication over the entire wafer area or over the entire useful wafer cells area. Without limiting the invention, in order to obtain a patterned electrode, the conductive material can be deposited through a shadow mask, where the areas not to be coated are blocked by a metal mask.

Depending on the type of tunable active optical element to be wafer fabricated, for example for an electro-optical liquid crystal device, the next step is to fabricate the liquid crystal (LC) cell. The glass wafers that form upper and lower surfaces of LC cells can first be coated with an alignment layer. This layer serves to align liquid crystal molecules. Typically, this will result in a surface with some microscopic texture. It may be a polyimide layer that is later textured by rubbing with a cloth or it may be an oxide film that is deposited in a manner which results in a highly textured surface.

After the textured surface is formed, the LC cell itself can be wafer fabricated. For example, three materials are deposited on one of the glass substrates (wafers) that form the LC cell. The first material can be any additional conducting material. This is often a conductive adhesive or solder. The second material can be a non-conductive adhesive, which is also deposited to define the area to be filled with liquid crystal material. Non-conductive adhesives are typically acrylic, epoxy or silicone materials. The third material is the liquid crystal material itself. In one or more of the deposited materials, spacers can be included, typically glass or polymer spheres of a tightly controlled size, which act to set the thickness of the LC cell. Subsequently, a second glass substrate (wafer) is placed on top of the deposited materials and the adhesive materials are cured using heat, pressure and/or light. Depending on the design of the electro-optical liquid crystal device, the second glass substrate (wafer) may have an electrode layer deposited thereon.

Next, for a TLCL electro-optical device, a lens structure is fabricated on a third glass substrate (wafer). In this context "lens structure" refers to a layered structure providing electric field modulation, the "LC structure" proving the optical lensing effect. The lens structure is typically fabricated from polymer layers with varying electrical and optical properties. Additional conductive materials (such as conductive adhesives and solders) and structural material (such as glass, polymer or metal spacers) may also be incorporated. The third glass substrate (wafer) may include a third electrode layer. After fabrication, the lens structure is then bonded to the LC cell using an optical adhesive material. At this point, one half of a TLCL has been fabricated in wafer form. For certainty, certain electro-optical liquid crystal device designs do not require the second electrode.

Figure 5A:
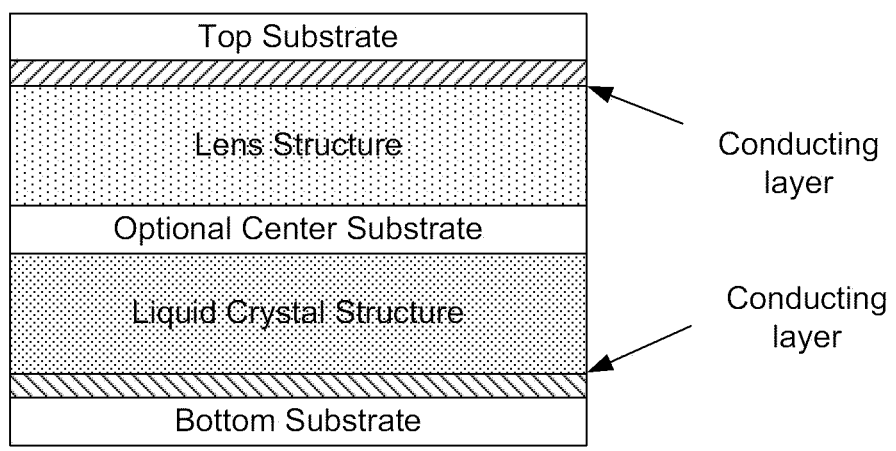
FIGS. 5A and 5B are schematic diagrams illustrating one half of a Tunable Liquid Crystal Device (TLCL) structure in cross-section and plan view, respectively.
Figure 5B:
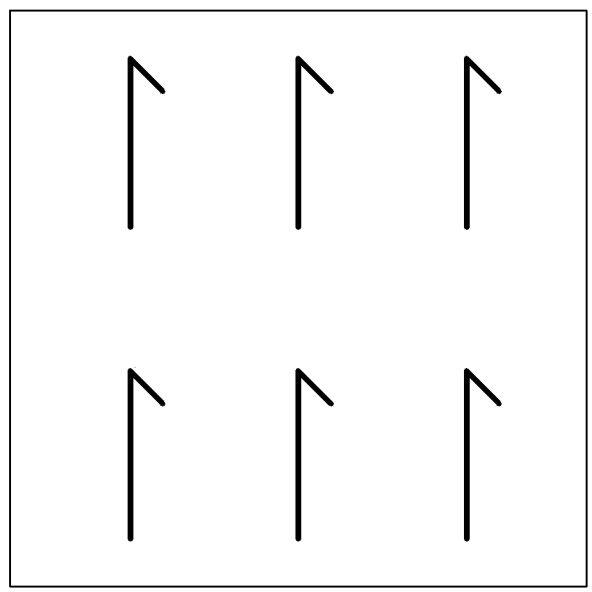

FIGS. 5A and 5B illustrate cross-section and plan views, respectively, of an example of a basic structure of one half of a tunable liquid crystal device (TLCL). A complete or full TLCL is composed of two such half TLCLs, an advanced example of which is described in co-pending commonly assigned published International Patent Application Publication WO 2009/153764 entitled "Electro-Optical Devices Using Dynamic Reconfiguration of Effective Electrode Structures" claiming priority from 21 Jun. 2008, the entirety of which is incorporated herein by reference. Other variants of this TLCL structure work. Without limiting the invention, the subject matter described herein may apply equally to those variants.

In accordance with a non-limiting example, the half TLCL illustrated in FIGS. 5A and 5B is composed of two main layers: the liquid crystal (LC) layer and the lens structure layer. These layers are bounded by two additional layers consisting of substrates with conductive electrodes. An optional central substrate may serve as a dividing layer between the LC layer and lens structure layer. For certainty, the lens structure layer, the optional center substrate, and the liquid crystal structure are shown as examples only. In this context "lens structure" refers to a layered structure providing electric field modulation, the "LC structure" proving the optical lensing effect. The type, number and functionality of layers employed relates to the tunable active optical device properties which provide an overall device functionality such as but not limited to an optical shutter, beam steering element, etc. in this example a variable focus device.

The plan view of FIG. 5B shows one additional feature of the half TLCL, notably that the LC layer has a unique orientation along one direction. Because of this property of the LC, a half TLCL only affects one polarization (half of the light) passing through the device. In order for all of the light passing through the device to be affected by the LC, a second half TLCL, with its polarization rotated by 90 degrees (orthogonal), can also be used.

Testing of such wafer manufactured singulated (diced dies) or non-singulated (wafers) tunable active optical device elements may be performed at this point in the manufacturing process. For example, FIGS. 9 to 12 hereinbelow describe tunable active optical device element testing, including testing of single electrode elements employing external electric fields in accordance with a first embodiment of the proposed solution. Wafer scale testing is also described hereinbelow.

For full polarization TLCLs, the next step involves bonding two half TLCL wafers together. The two wafers are placed with their bottom glass substrates back to back. In addition, one wafer is rotated 90 degrees relative to the other, so that the alignment of the LC cells in one half TLCL is at 90 degrees with respect to the other. An optical adhesive is employed between the two wafers and the wafers are aligned such that the optical axes of the individual devices in each wafer are aligned. The optical adhesive is then cured using heat, pressure and/or light.

Figure 6A:
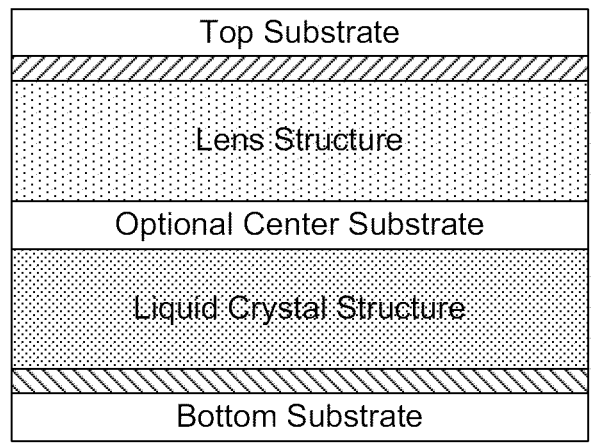
FIGS. 6A, 6B, 6C and 6D are schematic diagrams illustrating one half of a TLCL juxtaposed with the second half of the TLCL, where the second half (shown in FIGS. 2C and 2D) has been rotated in the plane of the device by 90 degrees.
Figure 6B:
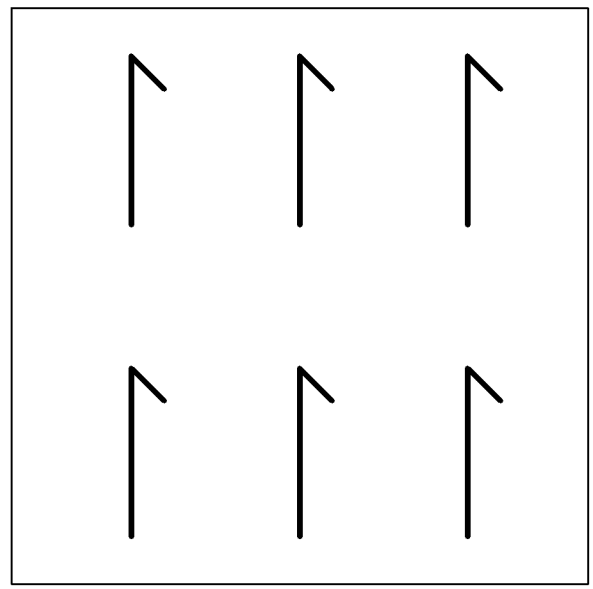
Figure 6C:
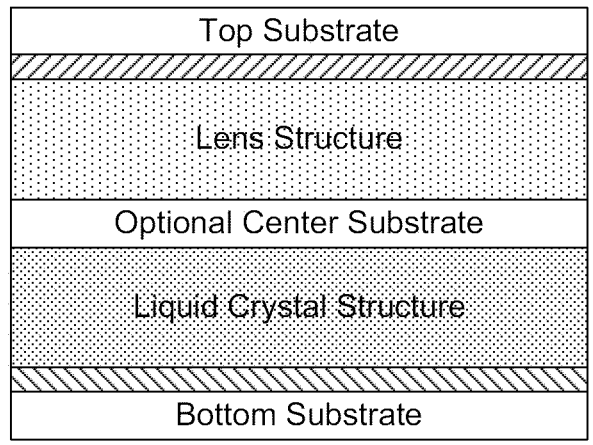
Figure 6D:
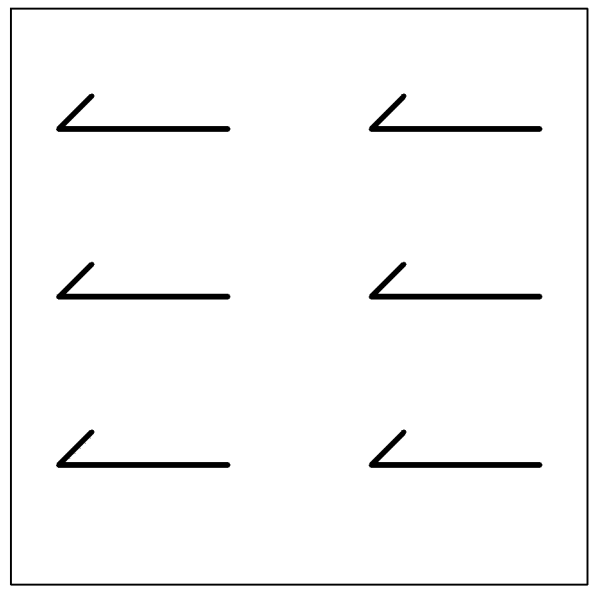

FIGS. 6A and 6C show two half TLCLs in cross-section view, the second half TLCL of FIG. 6C being rotated in the plane of the device by 90 degrees to provide a full polarization TLCL. This rotation is more clearly shown in the plan views of FIGS. 6B and 6D, which correspond to FIGS. 6A and 6C, respectively.

Figure 7A:
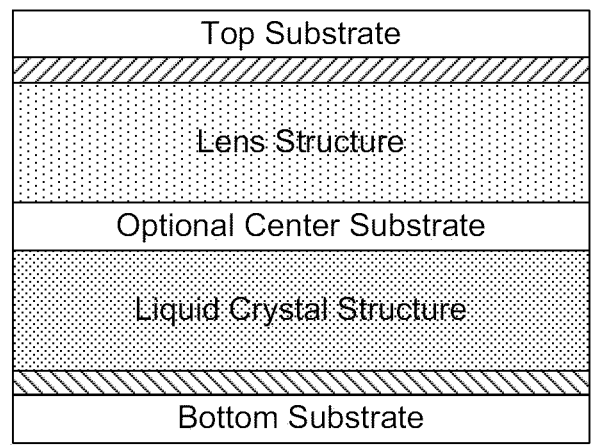
FIGS. 7A, 7B, 7C and 7D are schematic diagrams illustrating one half of a TLCL juxtaposed with the second half of the TLCL, where the second half (shown in FIGS. 7C and 7D) has been rotated in the plan of the device by 90 degrees and flipped over such that the top and bottom of the second half of the TLCL are reversed relative to the first half of the TLCL.
Figure 7B:
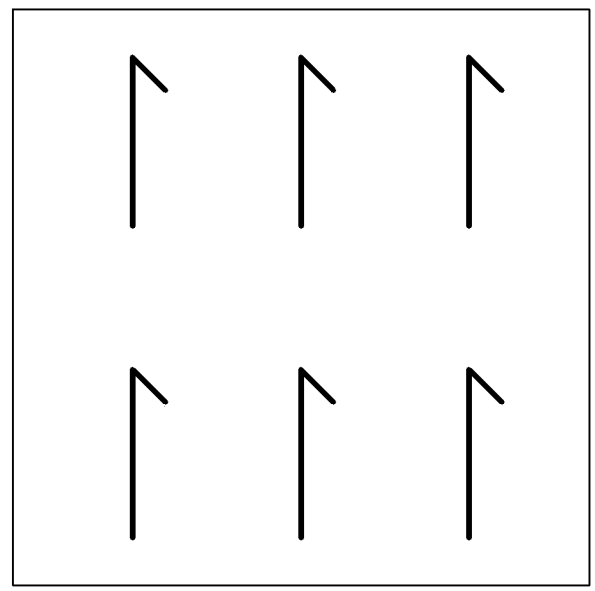
Figure 7C:
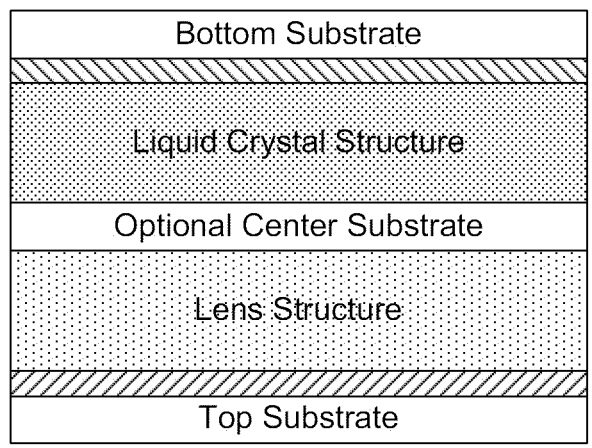
Figure 7D:
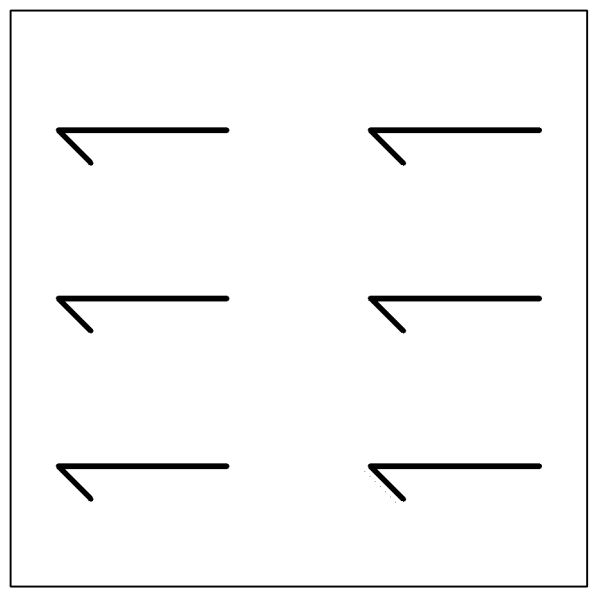

FIGS. 7A and 7C show two half TLCLs in cross-section view, the second half TLCL of FIG. 7C being rotated in the plane of the device by 90 degrees and flipped over such that the top and bottom of the device are reversed relative to the half TLCL of FIG. 7A. This rotation and flipping is more clearly shown in the plan views of FIGS. 7B and 7D, which correspond to FIGS. 7A and 7C, respectively.

Figure 8A:
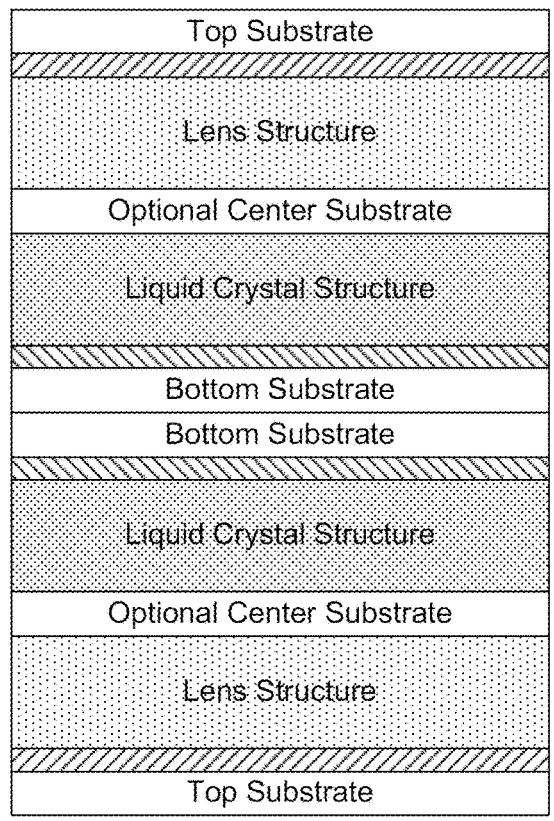
FIGS. 8A and 8B are schematic diagrams illustrating a complete full polarization TLCL formed by mating together the first and second halves of the TLCL of FIG. 7, in side view and plan view, respectively.
Figure 8B:
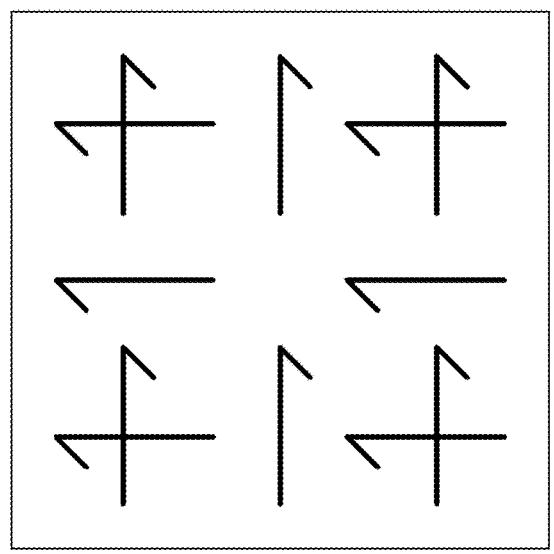

In FIG. 8A, a complete TLCL according to the present invention is illustrated, similar to an embodiment illustrated by inventors T. Galstian, V. Presniakov, K. Asatryan in FIG. 11 of commonly assigned International Patent Application Publication WO 2007/098602 published Sep. 7, 2007, entitled "Method and Apparatus for Spatially Modulated Electric Field Generation and Electro-Optical Tuning using Liquid Crystals", and co-pending with US020070229754, the entirety of which are incorporated herein by reference. More specifically, the two half TLCLs of FIGS. 7A and 7C are mated together in accordance with the proposed solution, connected at their bottom surfaces. The resulting combined (full) polarization of the complete TLCL is shown in FIG. 8B.

Wafer scale testing can also be performed at this point in the wafer manufacturing process. Testing can include providing incident light having one of a random polarization, a circular polarization and a linear polarization aligned with the single polarization of at least one of the half TLCLs in the pair.

Singulating the TLCLs from the wafer follows. Singulating may be done via a scribe and break process, a mechanical dicing process or an optical dicing process, among other possibilities. In a scribe and break process, a linear defect (the scribe line) is formed in the wafer and then the wafer is stressed until the wafer fractures along the linear defect. For mechanical dicing, an abrasive wheel is used to remove a strip of material that separates a part of the wafer. In an optical dicing process, a laser is used to remove a strip of material to separate the wafer.

Individual tunable active optical element testing can be performed at this point in the manufacturing process as described hereinbelow.

The singulated complete tunable active optical element can then be packaged by making contact to wires, lead frames or flexible circuits. For example, in order to power the complete TLCL, the conductive layers (e.g. electrodes) adjacent to the lens structure layers in both half TLCLs are connected together and to an external contact. Similarly, the conductive layers (e.g. electrodes) adjacent to the LC layers in both half TLCLs must be connected together and to a different external contact. A conductive adhesive or solder may be used to make these connections, after which the area around the perimeter of the TLCL is filled with an encapsulating material that protects the TLCL from harsh environments and mechanical abuse. Making these electrical connections in such a tunable liquid crystal device is neither simple nor inexpensive. Since the conductive layers are necessarily very thin, making robust and reliable connections to electrode layer edges is difficult to do. Furthermore, care must be taken such that, when making the contacts, the opposite electrodes are not also contacted.

Figure 9:
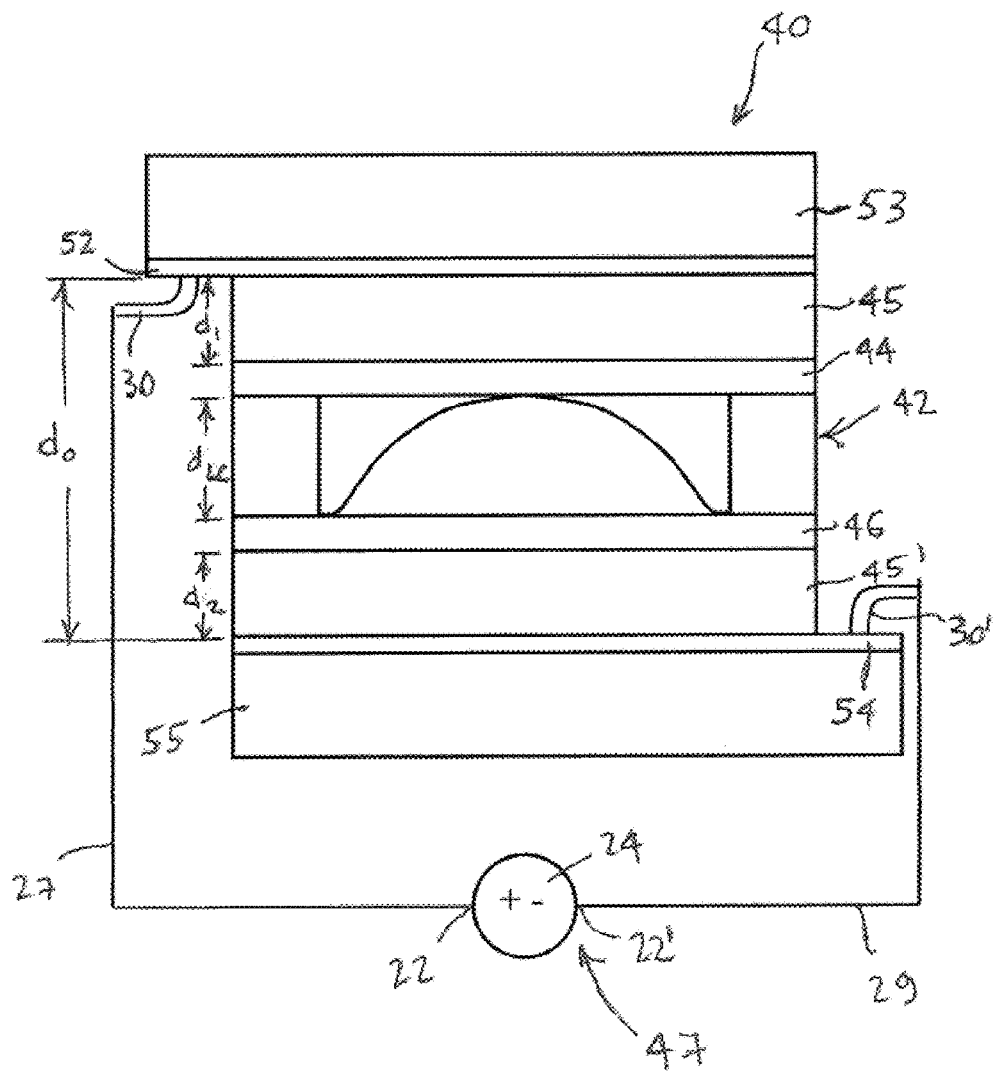
FIG. 9 is a schematic diagram showing an embodiment of an apparatus for testing operation of an electro-optical liquid crystal device in accordance with a first aspect of the proposed solution.

Testing the Operation of Electro-Optical LC Devices Using External Electric Fields Referring now to FIG. 9, according to a first embodiment of the proposed solution, there is illustrated an apparatus 40 for testing operation of an electro-optical liquid crystal device 42 having first and second driving electrodes 44, 46 for operating the device, which electrodes are disposed in a predetermined spatial relationship with respect to one another as being provided on respective substrates 45, 45'. Without limiting the invention, while in the example illustrated in FIG. 9, device 42 is a Tunable-focus Liquid Crystal Lens (TLCL), apparatus 40, and its method of operation, may be employed to test the operation of any electro-optical liquid crystal device having an optical response to a drive signal supplied thereto. Another electro-optical liquid crystal device type is a liquid crystal display cell.

Furthermore, the apparatus 40 can be adapted to test electro-optical devices provided with a single driving electrode, or provided with more than two driving electrodes, depending on the particular design of the device to be tested. The apparatus 40 includes an electrical arrangement generally designated at 47 for applying to the liquid crystal device 42 an external electric field to produce a dipolar charge distribution within driving electrodes 44 and 46 of the electro-optical liquid crystal device, causing operation of the liquid crystal device 42, in a way that will be explained later in more detail.

As will be described later with reference to FIGS. 11 and 12, apparatus 40 further includes a light source 48 for directing incident light toward the electro-optical liquid crystal device 42 substantially along an optical axis 50 thereof, and further includes an optical sensor 51 responsive to an (optical) effect of the liquid crystal operation on the incident light. The invention is not limited to an optical effect in the same optical spectrum as that of the incident light. For example, while the incident light is in the visible spectrum, the optical sensor 51 may measure Infra-Red radiation emanating from the electro-optical liquid crystal optical device.

Referring back to FIG. 9, the electrical arrangement 47 includes first and second test electrodes 52, 54 connected to the output terminals 22, 22' of an external electrical voltage source 24, through lines 27, 29 and connectors 30, 30'. It is to be understood that the number of testing electrodes 52, 54 to be used by the apparatus 40 is related to the number of driving electrodes 44, 46 provided on the particular electro-optical liquid crystal device 42 to be tested. The test electrodes 52, 54 are provided on respective first and second substrates 53, 55 made of a transparent material, e.g. glass, and are configured to be disposed in a predetermined spaced relationship with respect to the corresponding driving electrodes 44, 46 to generate an external electric field at a predetermined intensity (voltage value) between driving electrodes 44, 46.

In the illustrated example, each test electrode 52, 54 is planar (layer) and may be obtained through a substrate coating process using an optically transparent and electrically conductive material, such as, e.g., Indium Tin Oxide (ITO).

The external electric field E generated by test electrodes 52, 54 may be expressed as a function of the applied electrical voltage V_0 according to the following general relation:

$$E \approx f(V_0, d_0, \pounds 1 \ldots \pounds n) \quad (1)$$

wherein:
d o is the distance separating the test electrodes 52, 54; and
£1 ... £n represent permittivity values characterizing the various layers of material constituting the electro-optical liquid crystal device 42 under test.

In practice, the external voltage value V_0 to be applied to the testing electrodes 52, 54 in order to obtain a resulting operating voltage value V LC between driving electrodes 44, 46 can be easily estimated in view of FIG. 9 using the following relation:

$$V_{LC} = V_0 - (V_1 + V_2) = V_0 - \left( \int E_1 dz + \int E_2 dz \right) \approx V_0 - \frac{Q}{A}\left(\frac{d_1}{\varepsilon_1} + \frac{d_2}{\varepsilon_2}\right)$$

wherein:
E 1 and E_2 are electric field values across substrates 45 and 45' through their respective thicknesses d_1 and d_2;
Q is an amount of charge appearing on electrodes 44, 46;
A is the surface area of electrodes 44 and 46; and
S and £*2>are mean permittivity values characterizing substrates 45 and 45'.

Alternatively, the external voltage value V_o to be applied can be set experimentally using optical sensor 51, on the basis of a known reference effect of the liquid crystal operation on reference incident light.

Figure 10:
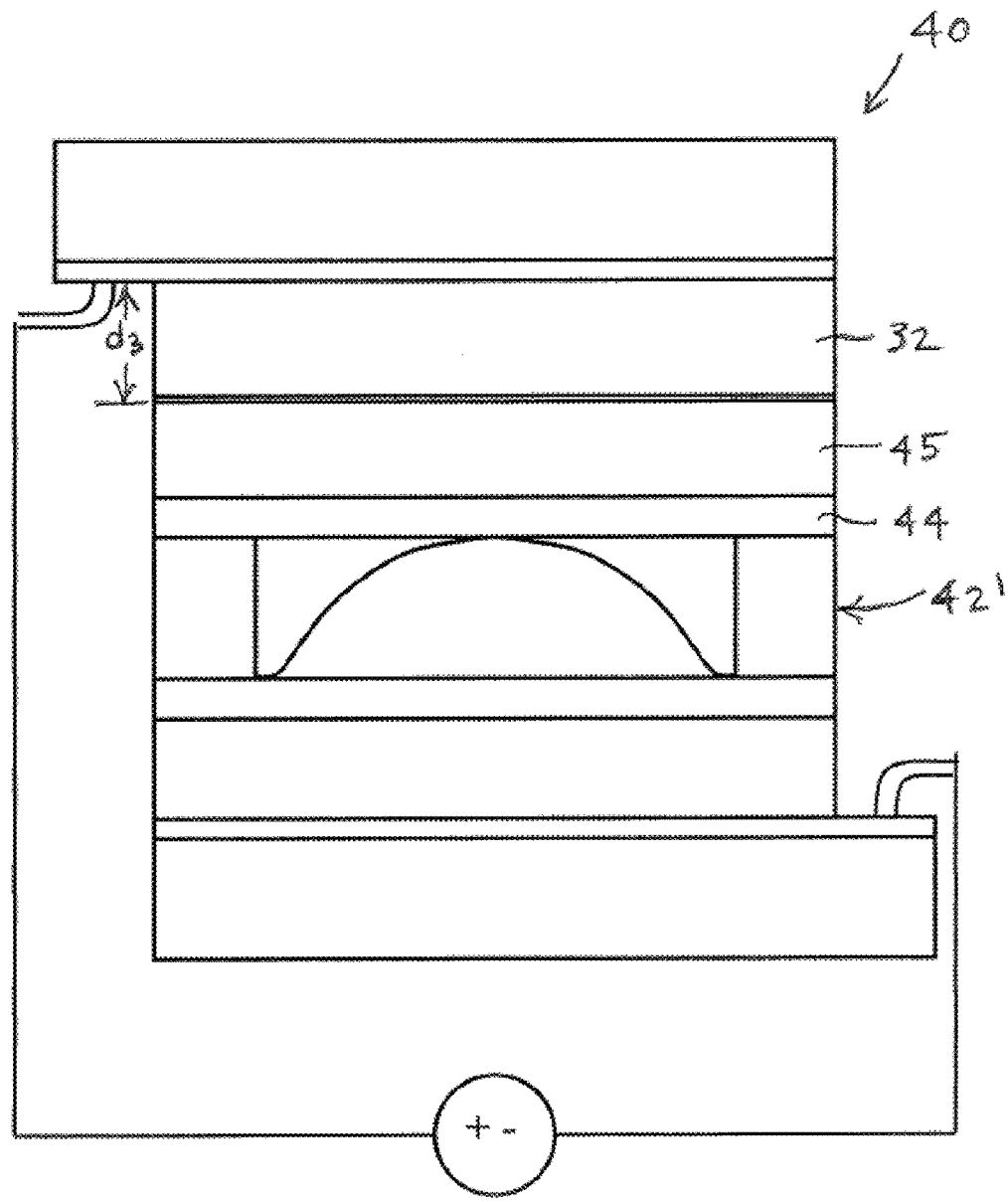
FIG. 10 is a schematic diagram showing another illustration of the embodiment of FIG. 9, wherein the electro-optical liquid crystal device is provided with an optional dielectric layer.

Referring now to FIG. 10, in a case where the apparatus 40 is used to test an electro-optical liquid crystal device 42' provided with an optional dielectric layer 32 of thickness d_3 relation (2) could be correspondingly modified to take into account permittivity £3 characterizing layer 32.

Figure 11:
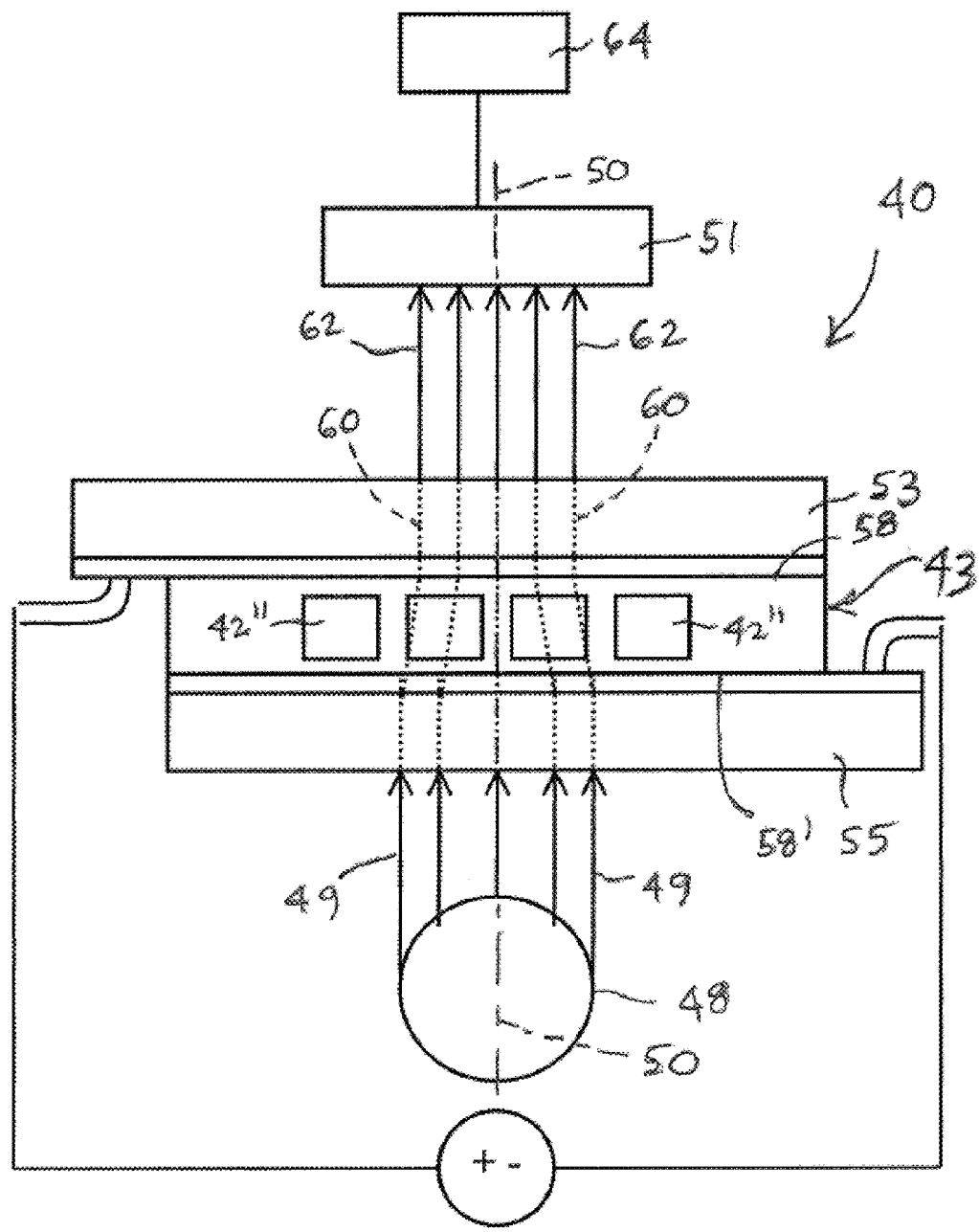
FIG. 11 is a schematic diagram showing an embodiment of an apparatus for testing operation of a multiple electro-optical device unit, according to a light transmission effect sensing mode.

FIG. 11 illustrates apparatus 40 as described above with reference to FIG. 9 in operation when used for testing the operation of multiple electro-optical liquid crystal devices in accordance with an implementation of the first embodiment. In accordance with this implementation, a light transitivity effect of a electro-optical liquid crystal device is sensed. A multi-unit device 43 including a multitude of electro-optical liquid crystal devices 42'' is being tested, testing multiple electro-optical liquid crystal devices 42'' in parallel using a same apparatus 40. It can be seen that the multi-unit device 43 has its first and second opposed planar surfaces 58, 58' extending transversely with respect to optical path 50, and that incident light represented by light ray arrows 49 is directed through second substrate 55 and second surface 58'. In this configuration, the optical effect is sensed by sensor 51 from first surface 58 through first substrate 53 as schematically indicated by light path lines 60 and light ray indicating arrows 62. It is to be understood that a symmetrical configuration, wherein incident light would be directed through first substrate 53 and first surface 58, could also be used by disposing light source 48 and sensor 51 accordingly.

Figure 12:
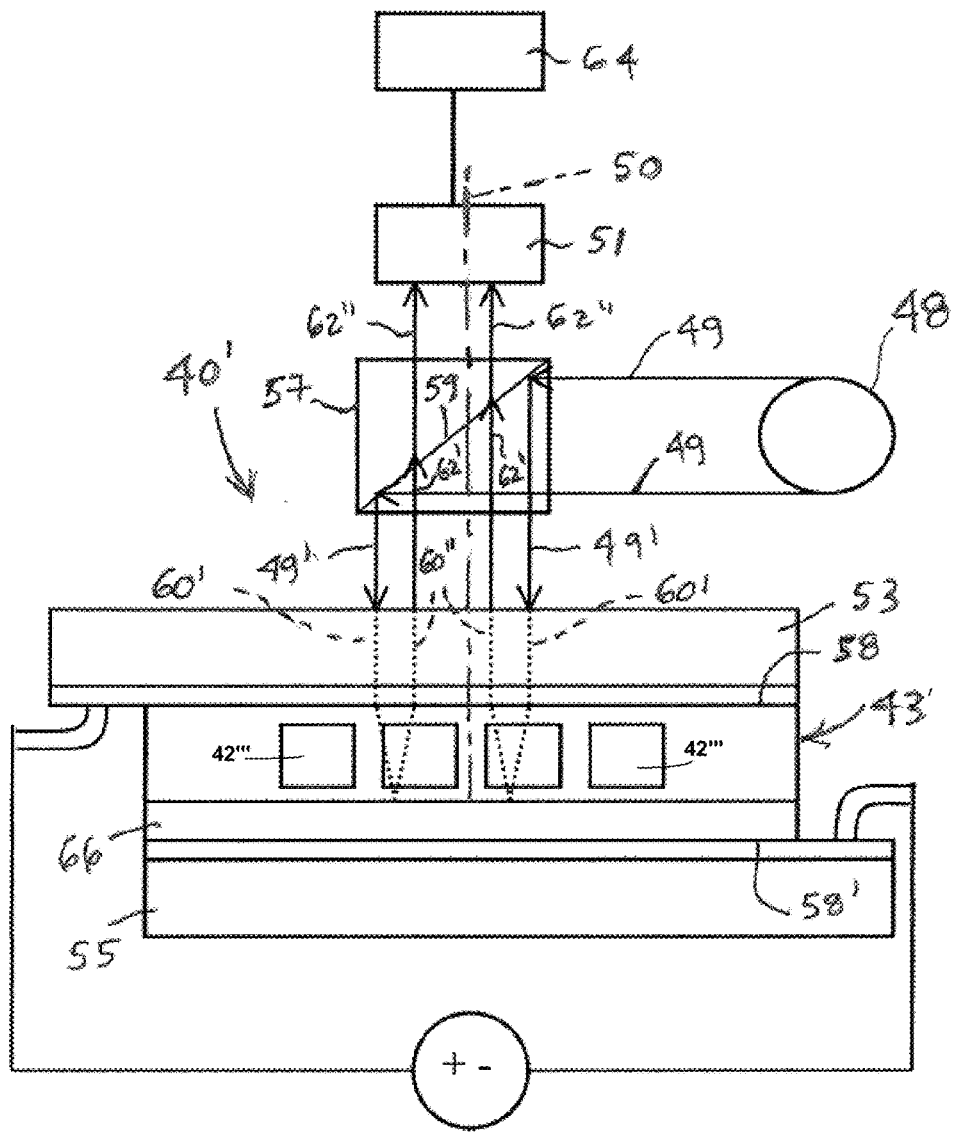
FIG. 12 is a schematic diagram showing an embodiment of an apparatus for testing operation of a multiple electro-optical device unit, according to a light reflection effect sensing mode.

FIG. 12 illustrates apparatus 40', similar to apparatus 40 described above with reference to FIG. 9, in operation when used for testing the operation of multiple electro-optical liquid crystal devices in accordance with another implementation of the first embodiment. In accordance with this implementation a light reflectivity effect of electro-optical liquid crystal device is being sensed. A multi-unit device 43' including a multitude of electro-optical liquid crystal devices 42''' is being tested, testing multiple electro-optical liquid crystal devices 42''' in parallel using a same apparatus 40'. In this implementation, apparatus 40' further includes an optical reflecting layer 66 made of an appropriate reflecting material, for example disposed adjacent to second surface 58'. In this implementation, incident light generated by source 48 and represented by light ray arrows 49 and 49' is directed through first substrate 53 and first surface 58, as schematically indicated by light path lines 60'. For so doing, an optical element 57 provided with a semi-transparent mirror 59 is conveniently used. The optical effect is sensed following incident light reflection off of layer 66, (from adjacent second surface 58') through first surface 58 and first substrate 53, as schematically indicated by light path lines 60'' and light ray indicating arrows 62', 62''. It is to be understood that an alternate symmetrical configuration, wherein the optical reflecting layer 66 would be disposed adjacent to first surface 58, incident light 49 would be directed through second substrate 55 and second surface 58', could be also used by disposing light source 48, element 57 and sensor 51 accordingly. In that alternate configuration, the optical effect would be sensed following incident light reflection off of layer 66, (from adjacent first surface 58) through second surface 58' and second substrate 55. For example, sensor 51 can be configured to detect an interference pattern. Testing can include providing incident light having one of a random polarization, a circular polarization and a linear polarization aligned with the single polarization of at least one of the half TLCLs in the pair.

The apparatus 40, 40' can further include a data processor 64 for analyzing the sensor response to identify any defective portion of said multi-unit device 43, 43' and therefore to identify any defective electro-optical liquid crystal device 42", 42'", using appropriate algorithms, including but not limited to optical pattern matching algorithms.

Therefore in accordance with the first embodiment, the operation of at least one electro-optical liquid crystal device can be tested during fabrication without necessitating direct physical electrical contact with delicate driving electrodes of such electro-optical liquid crystal device eliminating the introduction of defects during testing. In accordance with the first embodiment, the operation multiple electro-optical liquid crystal devices manufactured employing wafer fabrication techniques can be tested during fabrication and prior to singulation without necessitating direct physical electrical contact with delicate driving electrodes of such electro-optical liquid crystal devices eliminating the introduction of defects during testing. In particular it is noted that in this embodiment scribe lines are free of power lines, signal lines, selection lines, sense lines, etc. and therefore can be as narrow as possible, the only size limitation being that required to prevent damage to electro-optical liquid crystal device dies during singulation.

While the above embodiment works for electro-optical liquid crystal devices having a small number of driving electrodes, electro-optical liquid crystal devices having multiple/complex control structures may require additional connectivity for testing purposes.

The proposed solution is further directed to contact structure for tunable active optical devices, such as, but not limited to: electro optical liquid crystal devices, contact structure which provides making reliable electrical connections to conductive layers of devices in an inexpensive manner, in the context of wafer scale manufacturing of such devices.

Figure 13:
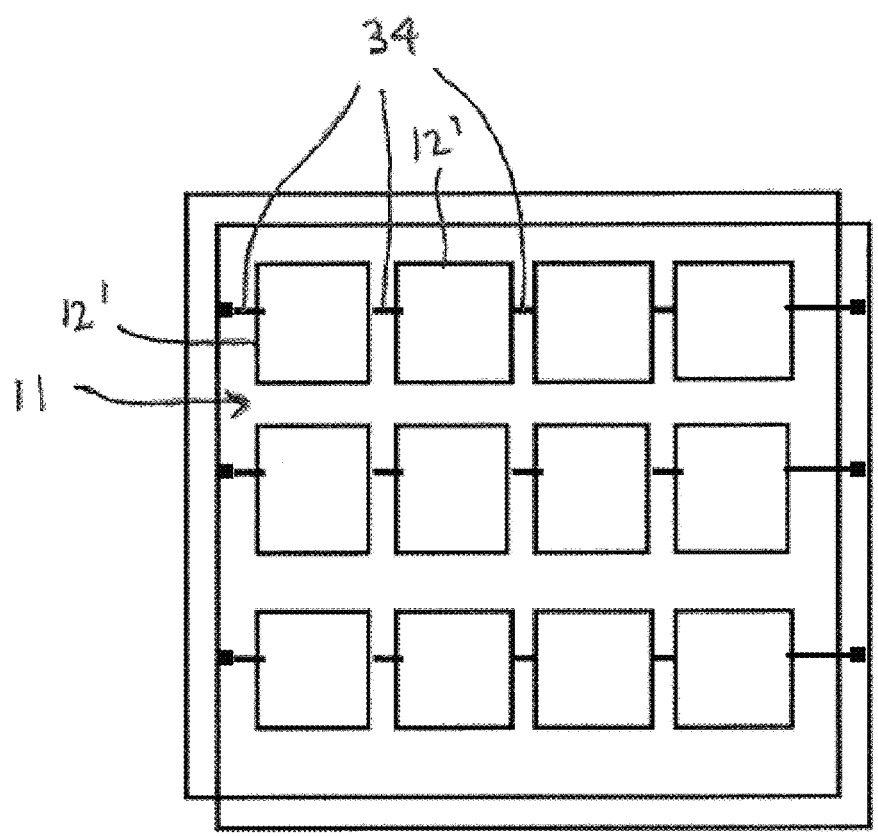
FIG. 13 is another schematic diagram showing an example of a multiple electro-optical device unit, showing available electrical contact locations in accordance with the proposed solution.

Multiple tunable active optical device units are fabricated (built) employing wafer fabrication techniques as cells (according to a parallel approach) ending with several configurations, e.g. linear, vertical, diagonal, or a combination thereof. It has been discovered that such configurations allow some degree of available electrical contact locations on either one or more (both) of the wafer (main) substrates, such as schematically shown in plan view by the contact locations designated at 34 in the example of multiple device unit 11 illustrated in FIG. 13.

FIGS. 14A to 14D illustrate the manufacturing of a complete electro-optical liquid crystal device graphically pointing out the typical location of an active optical region of such an electro-optical liquid crystal device (lens structure, liquid crystal structure). For example, for a TLCL an optical aperture is formed in this region. The side spaces (voids marked X) illustrated along the edges of the LC cells represent regions available for element electrical contact regions where electrical contact is made with electrode layers.

Referring back to FIG. 13, such contacts can be extended across multiple elements to wafer edges, as schematically shown, to permit external drive of the electro-optical devices 12'. The electro-optical devices 12' can thus be tested in parallel without difficulty using, for example, an appropriate holder (not shown) such as a jig provided with electrical connectors.

In accordance with a second embodiment of the proposed solution, a contact structure is wafer fabricated into tunable active optical element arrays to provide electrical contact with element driving electrodes over relatively large contact areas. Preferably the contact structure includes metallic strips fabricated across scribe lines during wafer fabrication of multiple electro-optical liquid crystal devices extending to wafer edges providing a reduced number of test electrode contact points on the wafer edges. Advantageously, the number of metallic strips in the contact structure provides less than one test electrode set of contacts per unsingulated die (without multiplexing circuitry). The fabrication of metallic strips across scribe lines permits high die density wafer fabrication without limiting the desired width of the scribe lines. Advantageously, despite fabricating the metallic strips across scribe lines to enable operational testing during wafer fabrication, such strips are not sacrificed, as post singulation, contact strip portions remaining in the electro-optical liquid crystal device layered structure are employed to provide electrical contacts during electro-optical liquid crystal device operation.

Figure 15:
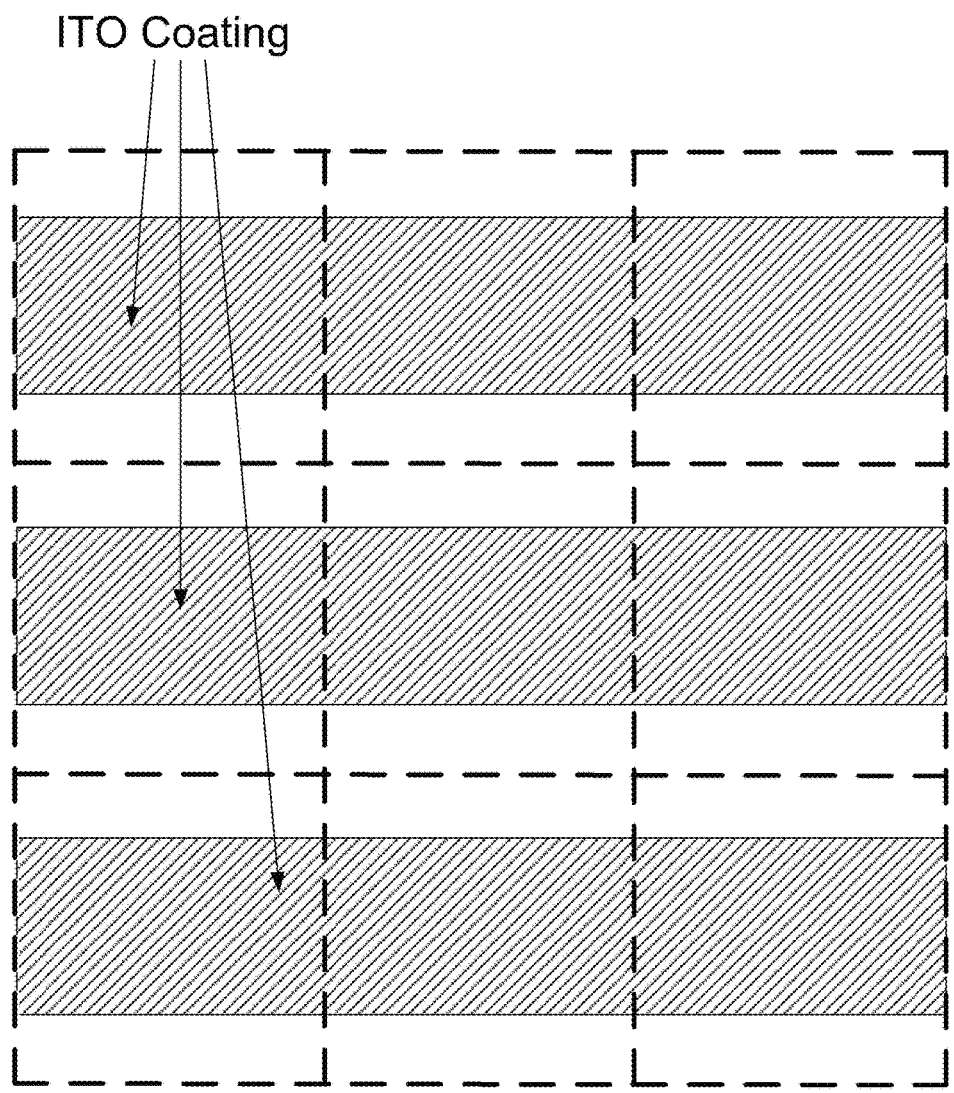
FIG. 15 is a schematic diagram showing conductive electrode layers forming the contact structure.
Figure 16A:
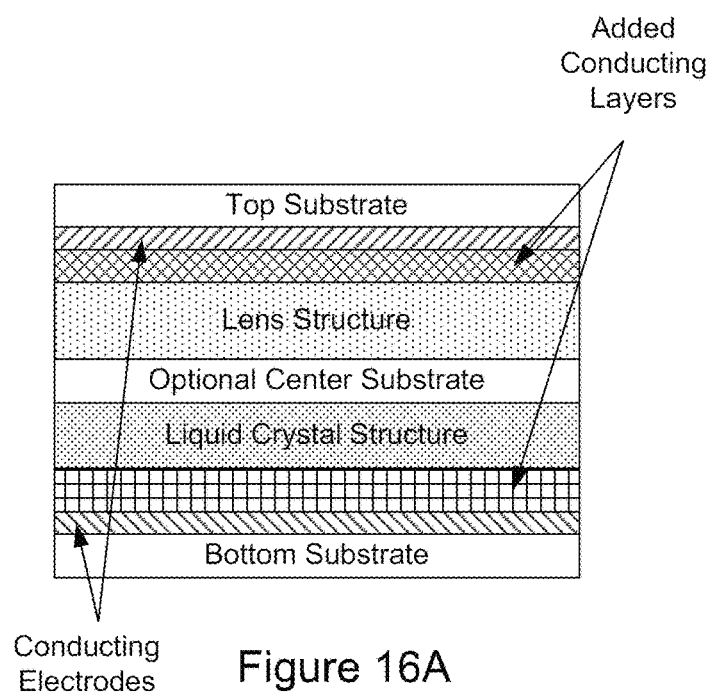
FIGS. 16A and 16B are schematic diagrams showing side and top views, respectively, of one half of a TLCL with a contact structure including an additional, thicker conducting structure formed around the perimeter of each electrode layer, in accordance with an implementation of the proposed solution.
Figure 16B:
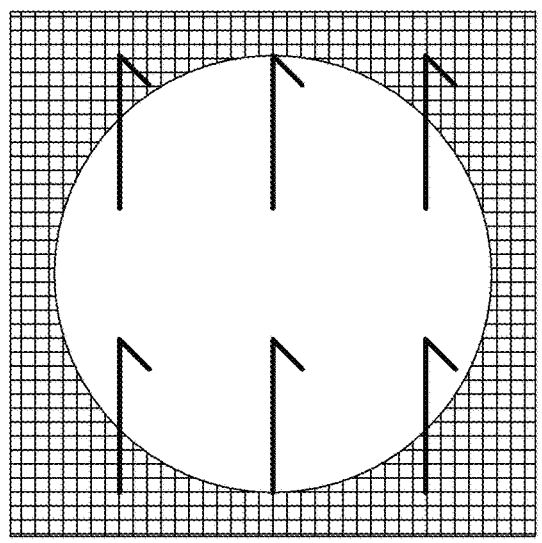
Figure 16C:
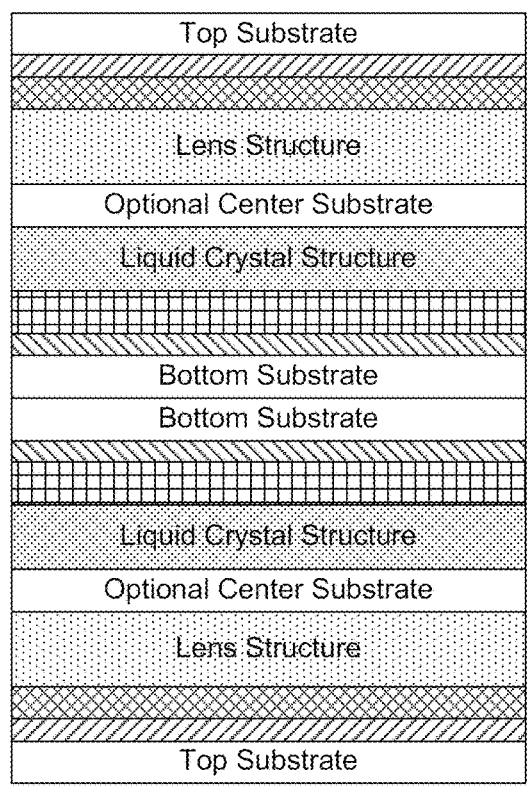
FIGS. 16C and 16D are schematic diagrams showing side and top views, respectively, of a complete TLCL formed by connecting together two half TLCLs of FIG. 16A at their bottom surfaces.
Figure 16D:
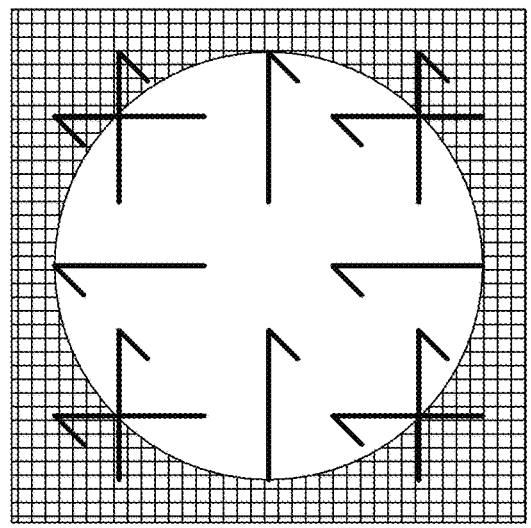

Method of Manufacturing of Electro-Optical LC Devices Having a Contact Structure Enabling Wafer Scale Testing In accordance with a first implementation of the second embodiment of the proposed solution, the contact structure can include conducting electrode layers extending over the entire wafer surface (FIG. 5) or patterned electrode layers, for example row electrode layers extending across rows of wafer cells are illustrated in FIG. 15. As described above, such electrode layers may be too thin for testing purposes, however in accordance with the proposed solution edge contacts for wafer scale testing may be provided by employing vias (not shown).

In a specific, non-limiting example, the extra conductive material that is added to the TLCL in order to form the contact structure, whether it be in the form of a layer arranged around the perimeter of each electrode or one or more localized areas on each electrode, is deposited onto electrode layers during fabrication of the TLCL. More specifically, after forming the electrode layer of the TLCL, for example by sputter depositing an ITO onto a glass substrate, the additional conductive material of the contact structure is deposited onto the electrode layer (in turn). A shadow mask may be used to ensure that a specific geometric shape, layout and/or position of the additional conductive material is defined on the electrode layer. This additional conductive material can typically also be ITO. Various different deposition techniques can be used to deposit the additional conductive material onto the electrodes layers.

In accordance with a second implementation of the second embodiment of the proposed solution, electrical contact with electrode layers can be provided via a contact structure of a patterned layer of conductive material extending over the entire wafer surface, for example a hole patterned conductive layer. FIGS. 16A to 16D illustrate the manufacturing of a complete TLCL. In this example, the TLCL has a contact structure that includes an additional, thicker conducting structure formed around the perimeter of on each element electrode layer, the hole patterned contact structure defining element apertures. Wafer scale testing of the entire wafer of elements is possible during fabrication. For example the thickness of the conductive structure can be between 10 to 50 microns, preferably between 15 to 40 microns, more preferably between 20 to 30 microns. Fabricating a contact structure 25 microns thick provides a good balance between size reduction and layer uniformity requirements. Electrical contacts for each element are provided after a simple singulation step. After dicing (cutting), this layer of additional conducting material provides better access to electrical layer contacts from the edge and is well suited for electro-optical liquid crystal devices having a reduced number of electrodes. With some care, shorting of the contacts may be avoided and this type of contact structure can be used with electro-optical liquid crystal devices having a moderate electrode arrangement complexity. However, this care to avoid shorting may involve a more complex and expensive packaging process.

In accordance with a third implementation of the second embodiment of the proposed solution, a non-limiting example of tunable active optical device wafer fabrication is illustrated in FIGS. 17 to 22. In accordance with the proposed solution the contact structure includes additional conducting material deposited locally on the conducting electrodes of multiple tunable active optical devices in an interconnected fashion during wafer fabrication. The location at which the additional conducting material is deposited differs for each conducting electrode in the half TLCL, such as on opposite sides or corners, however in some implementations adjacent sides or corners can be employed.

Figure 14A:
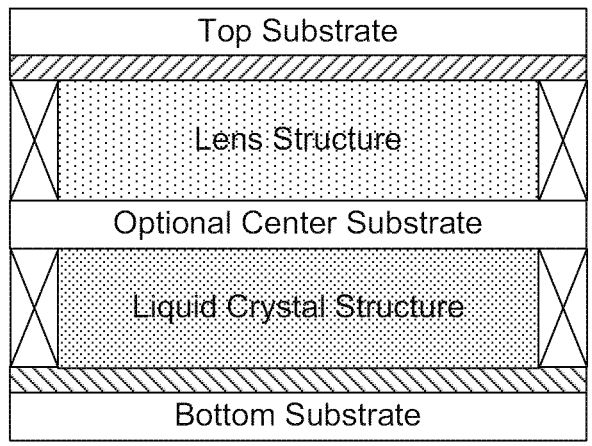
FIGS. 14A and 14B are schematic diagrams showing side and top views, respectively, of one half of a TLCL showing active regions of TLCLs and contact structure regions outside the active regions along the edges of dies (wafer cells), in accordance with a second embodiment of the proposed solution.
Figure 14B:
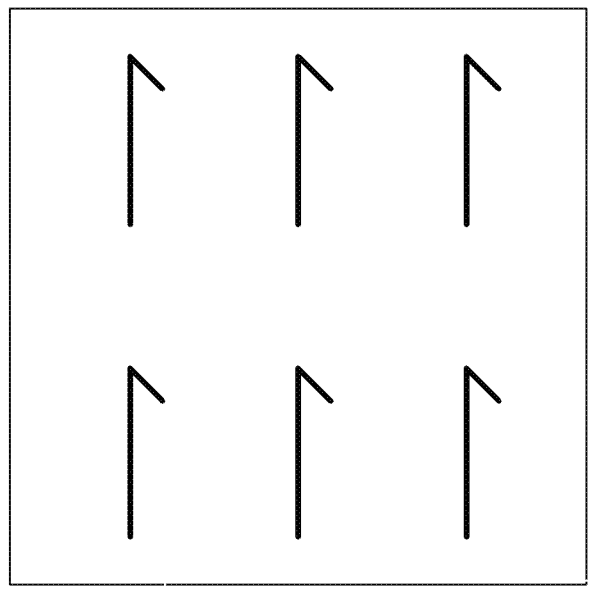
Figure 14C:
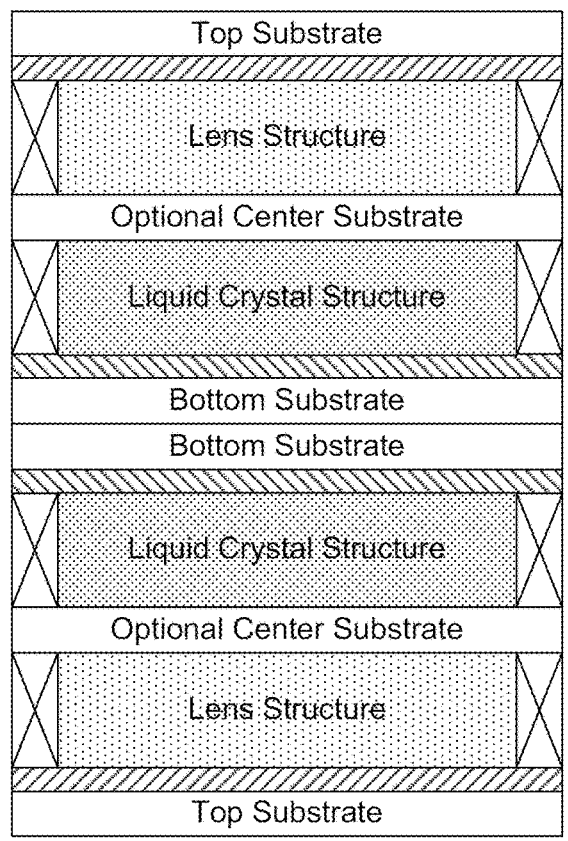
FIGS. 14C and 14D are schematic diagrams showing side and top views, respectively, of a complete TLCL formed by connecting together two half TLCLs of FIG. 14A at their bottom surfaces.
Figure 14D:
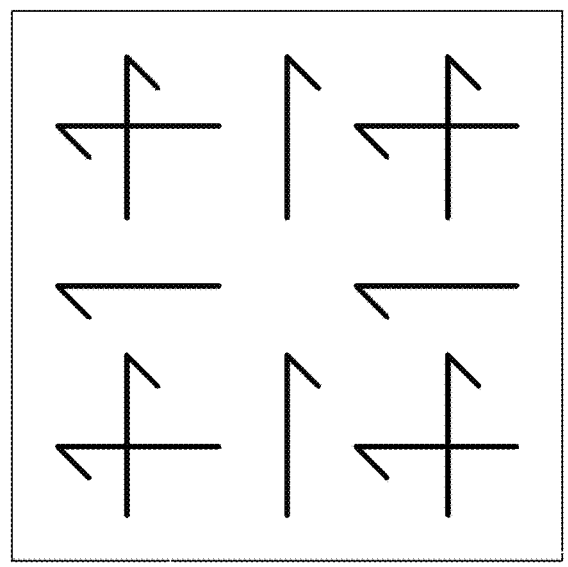
Figure 17A:
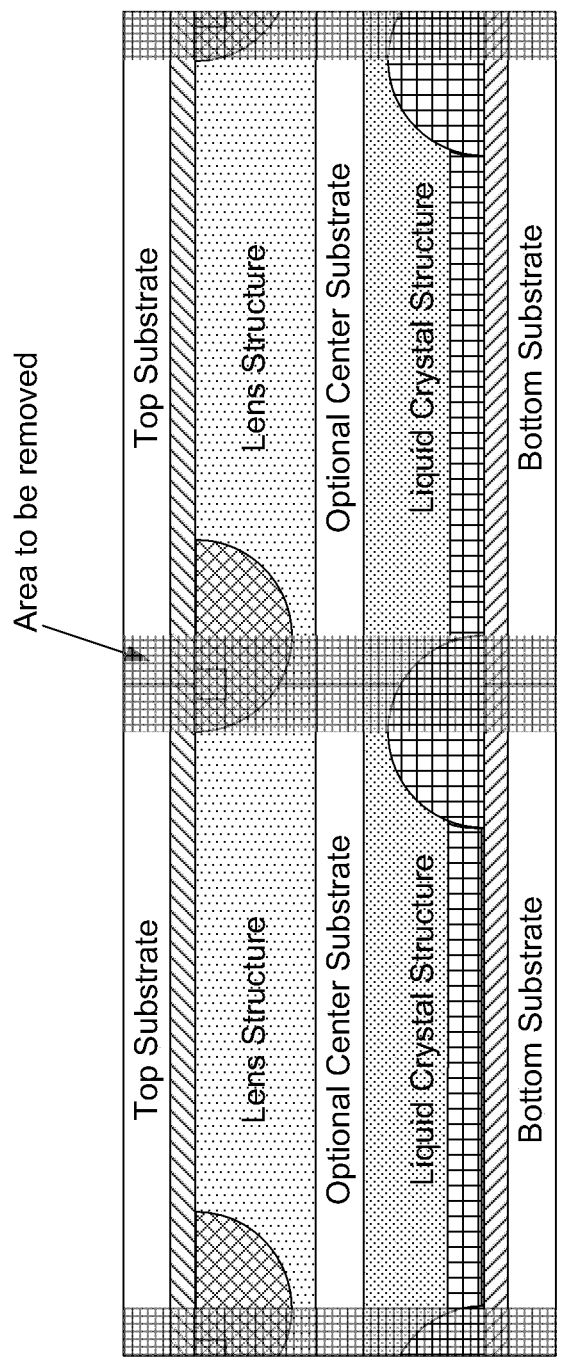
FIGS. 17A and 17B are schematic diagrams showing side and plan views, respectively, of a 2×2 region of a larger array of liquid crystal optical devices on a wafer prior to singulation (before dicing/cutting) occurs, where the gray areas are scribe line regions that will be removed in the cutting process.
Figure 17B:
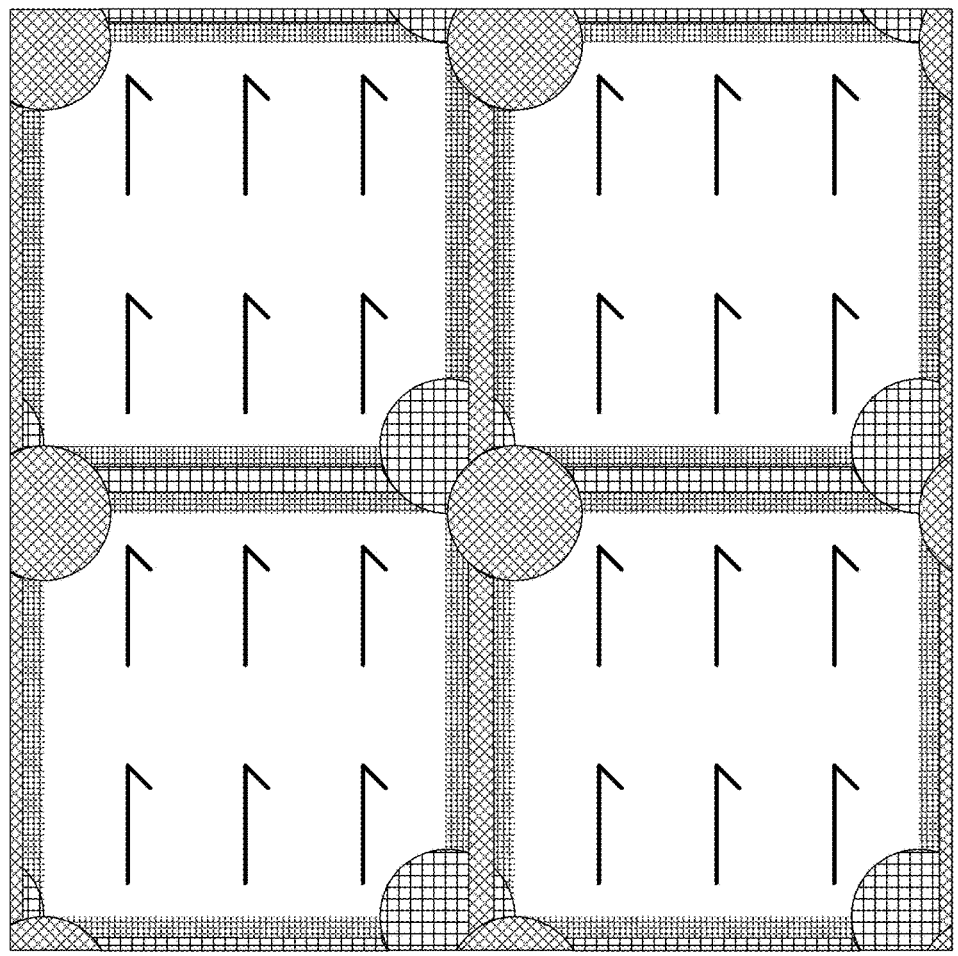

FIGS. 17A and 17B illustrate a 2×2 wafer cell region of a larger wafer array of half TLCLs of FIGS. 14A and 14B as would appear, in cross-section and plan view, respectively with conducting material in side spaces outside the optical aperture of the tunable active optical device. In accordance with this implementation, corner deposited bead conductive material is interconnected across the wafer in accordance with a contact structure pattern for example a contact strip pattern. Without limiting the invention, for example the conductive material beads in electrical contact with bottom substrate electrode layers are interconnected via a strip contact structure extending along rows of wafer cells, while the conductive material beads in electrical contact with top substrate electrode layers are interconnected via a strip contact structure extending along columns of wafer cells. Other patterns are envisioned.

Wafer scale testing during manufacturing may proceed at this point in the wafer fabrication process. In accordance with the proposed solution, the contact structure extends to wafer edges providing electrical contact locations for a limited number of test electrodes less than the number of tunable active optical element cells on the wafer. For example, employing the grid pattern strip contact structure, each half TLCL cell on the wafer may be selected for testing by providing a drive signal to strip contacts skew crossing at a wafer cell desired to be tested. Wafer scale testing is not limited to individual wafer cell testing, an entire row or column may be driven from the wafer edges via the contact structure, as well the entire wafer may be driven and tested.

Wafer scale testing may also be employed to test full TLCLs prior to dicing following the bonding (rotate and flip) by two unsingulated wafers having half TLCLs thereon by employing the combined contact structure to drive, from the edge of the wafers, single, a group of or all full TLCLs on the wafer.

Figure 17C:
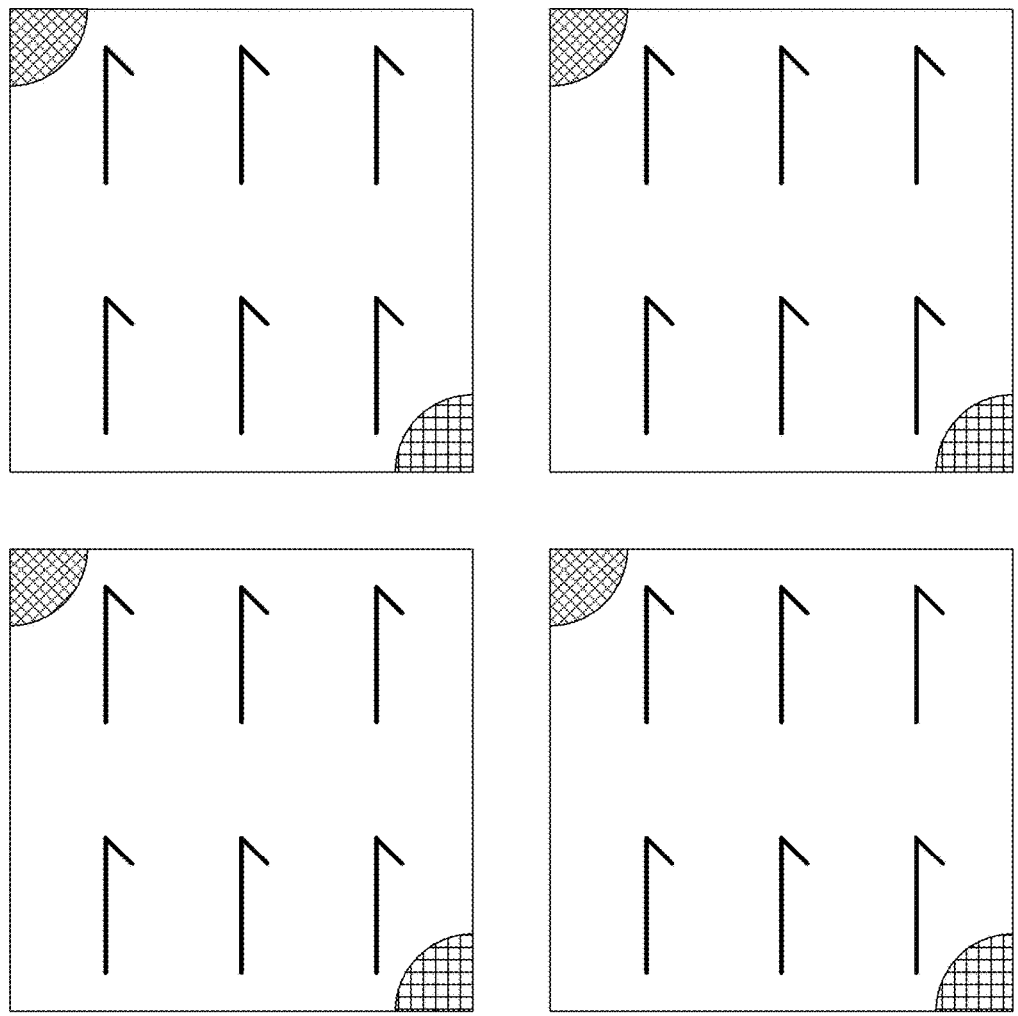
FIGS. 17D and 17C are schematic diagrams illustrating side and plan views, respectively, of the array of FIGS. 17A and 17B after singulation (dicing/cutting)
Figure 17D:
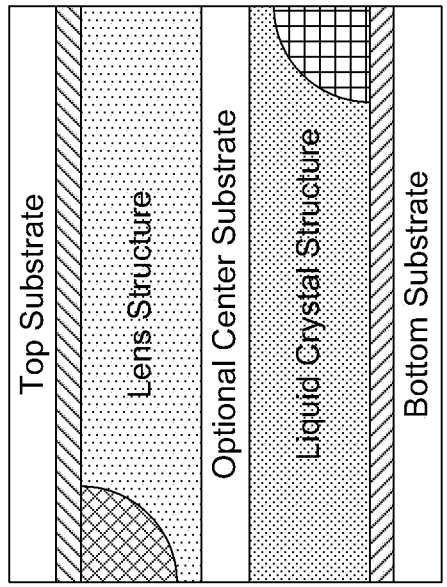
Figure 17D:
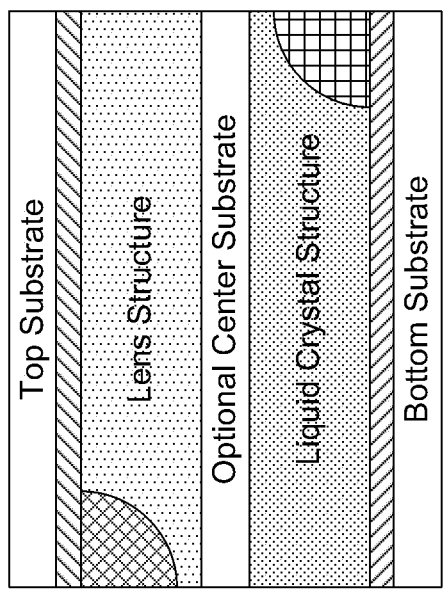

Returning back to FIG. 17B, the gray grid areas are kerf regions (scribe lines) that will be removed in the cutting (dicing) process. While the particular strip contact structure interconnecting the corner beads is illustrated within the kerf areas, such illustration is not meant to limit the invention, as shown hereinbelow with reference to FIG. 26 and subsequent. There may also be singulation processes where no material is removed between adjacent TLCLs (scribe and snap). FIGS. 17C and 17D illustrate how the wafer array may appear after cutting, resulting in singulated half TLCLs. Without limiting the invention, the strip contact material of the overall contact structure is shown removed by a cutting process, these strip contact would not be entirely removed by a scribe and snap singulating process. Regardless, portions of the corner beads of the contact structure remain in the tunable active optical device layered structure providing electrical contact connectivity during tunable active optical device use.

Figure 18A:
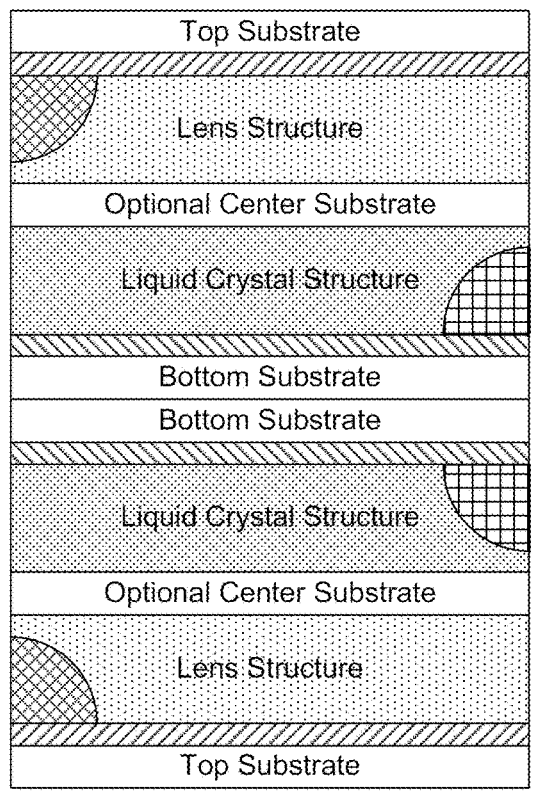
FIGS. 18A and 18B are schematic diagrams showing side and top views, respectively, of a complete TLCL formed by connecting together two half TLCLs of FIG. 17D at their bottom surfaces.
Figure 18B:
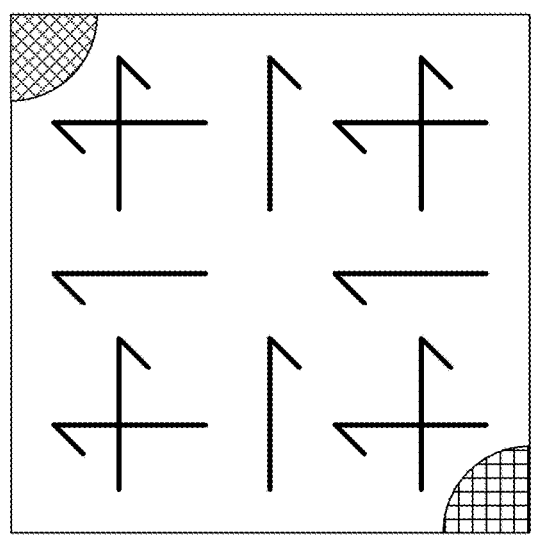

In order to manufacture complete TLCLs using cells FIG. 17D fabricated on the same wafer, which is desirable in fabricating full TLCL of matched half TLCLs, a second half TLCL is rotated, flipped and mated to the first half TLCL. The resulting structure is illustrated in FIGS. 18A and 18B. The full TLCL structure has top/bottom electrode contact areas segregated to opposite sides or corners, as shown. In some implementations the electrode contacts can be segregated to adjacent sides or corners.

Complete TLCL structures can be tested prior to integration by employing test electrodes in contact with the exposed remaining contact structure or by employing external field test techniques described herein above. Testing can include providing incident light having one of a random polarization, a circular polarization and a linear polarization aligned with the single polarization of at least one of the half TLCLs in the pair.

Figure 19A:
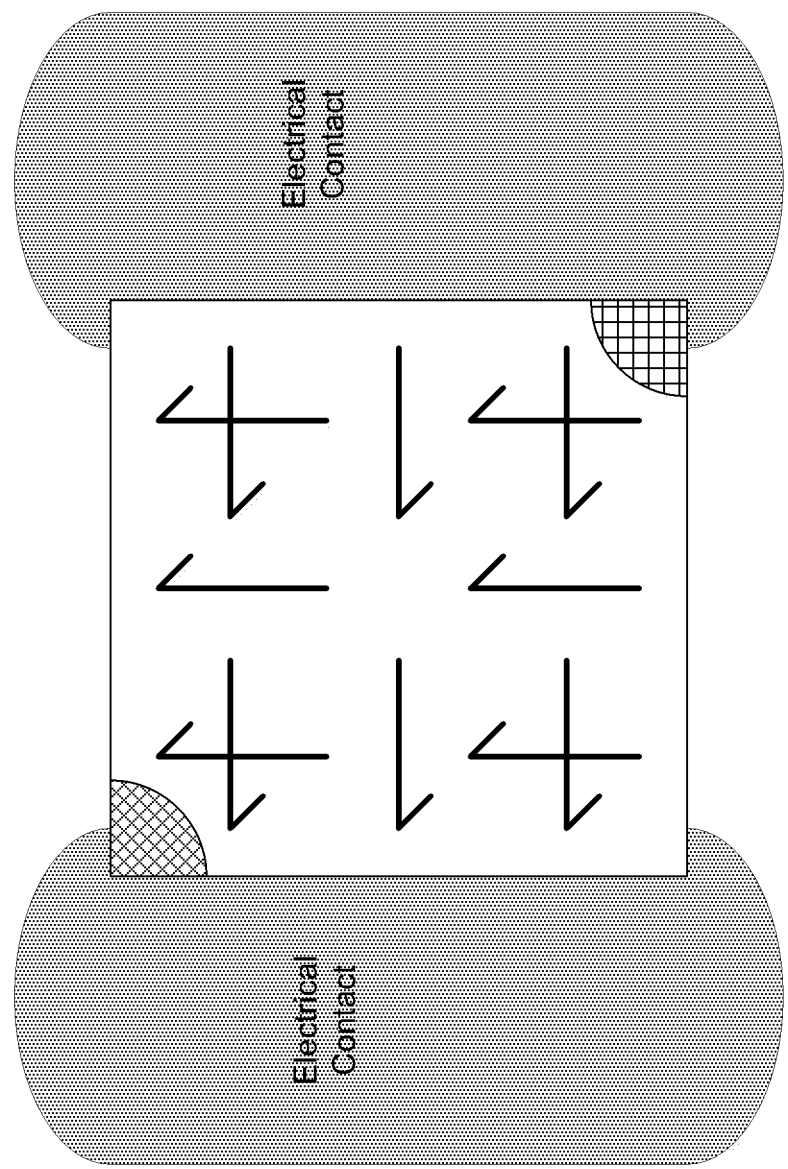
FIGS. 19A and 19B are schematic diagrams showing plan and side views, respectively, of the complete TLCL of FIGS. 18A and 18B with external full side contacts bonded to the device and making electrical contact with the contact areas of the strip contact structure, in accordance with a non-limiting implementation of the proposed solution.
Figure 19B:
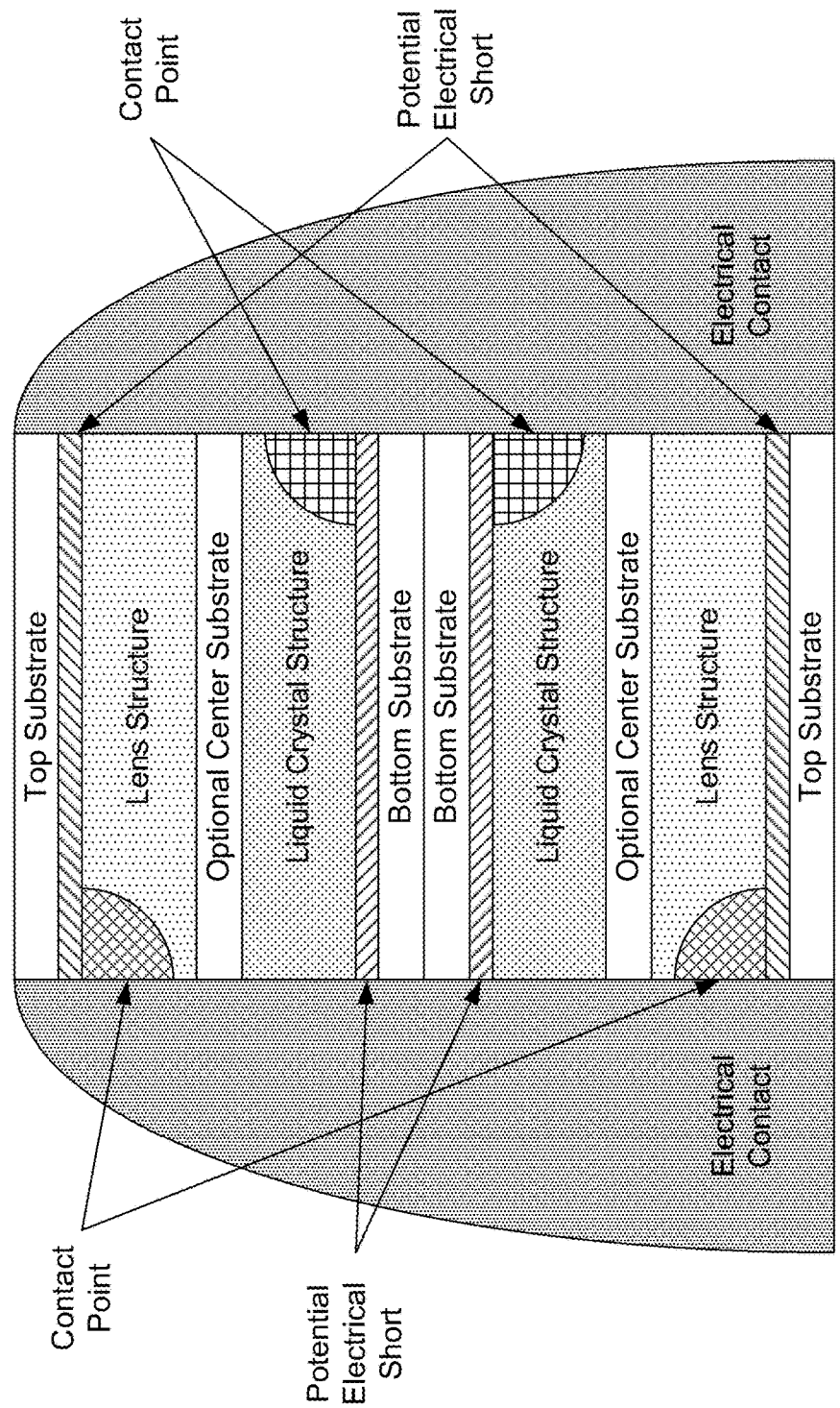

Without limiting the invention, in order to package the complete TLCL of FIG. 18A, this arrangement makes it possible to use an external contact structure, one such example being illustrated in FIG. 19A, at each corner of the full TLCL device in order to connect to the respective contact structure areas associated with each thin electrode layer for controlling the electric field applied to the TLCL device. At one corner of the device, the top electrodes are connected, and at the other, the bottom electrodes are connected. A mass of conducting material (i.e. an external contact structure) can be deposited on each side or corner of the device, as shown in FIGS. 19A and 19B. Advantageously, each mass of conducting material only contacts one set of electrode contacts of the device. However, with this TLCL configuration, it is still possible for the edges of the opposite electrode layers to electrically short to the external mass of conducting material, as shown. While such contacts may not be good electrical contacts, even poor contacts can produce undesirable effects.

Figure 20A:
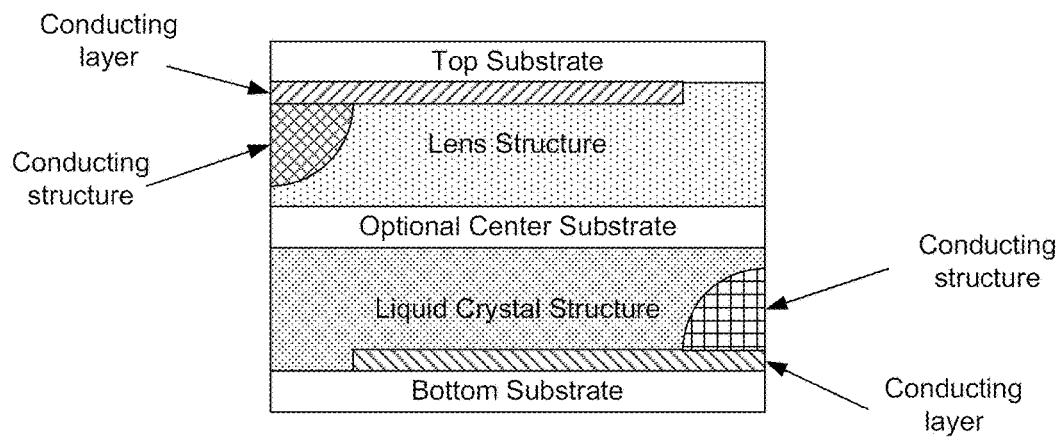
FIGS. 20A and 20B are schematic diagrams showing side and plan views, respectively of one half of a TLCL in which the top and bottom electrodes are patterned parallelograms recessed from two sides so as to prevent unwanted electrical contact during packaging, in accordance with yet another implementation of the proposed solution.
Figure 20B:
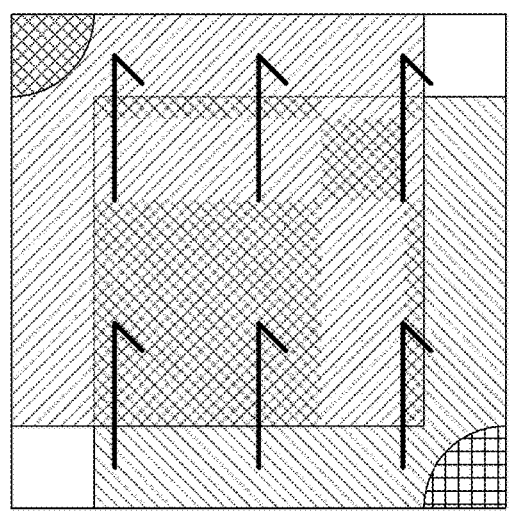
Figure 21A:
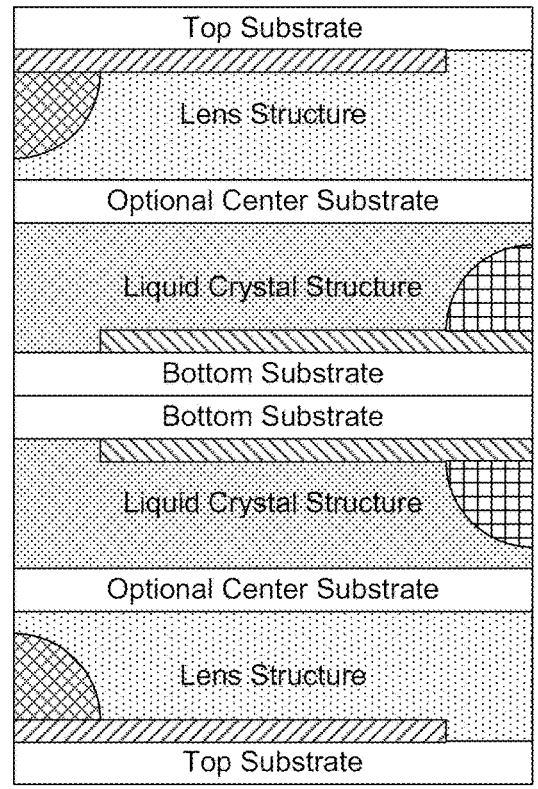
FIGS. 21A and 21B are schematic diagrams showing side and plan views, respectively, of a complete TLCL formed by connecting together two half TLCLs of FIG. 20A at their bottom surfaces.
Figure 21B:
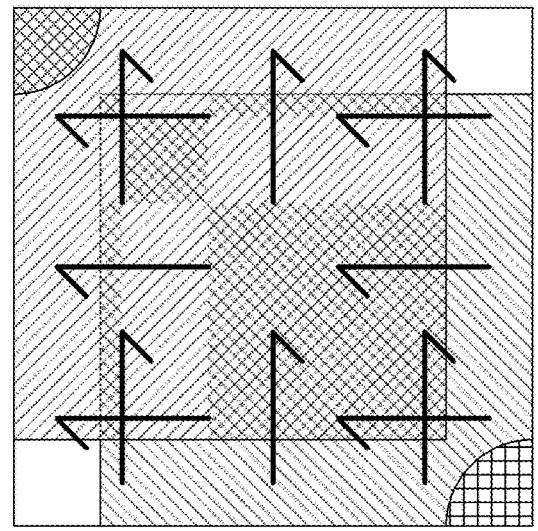
Figure 22A:
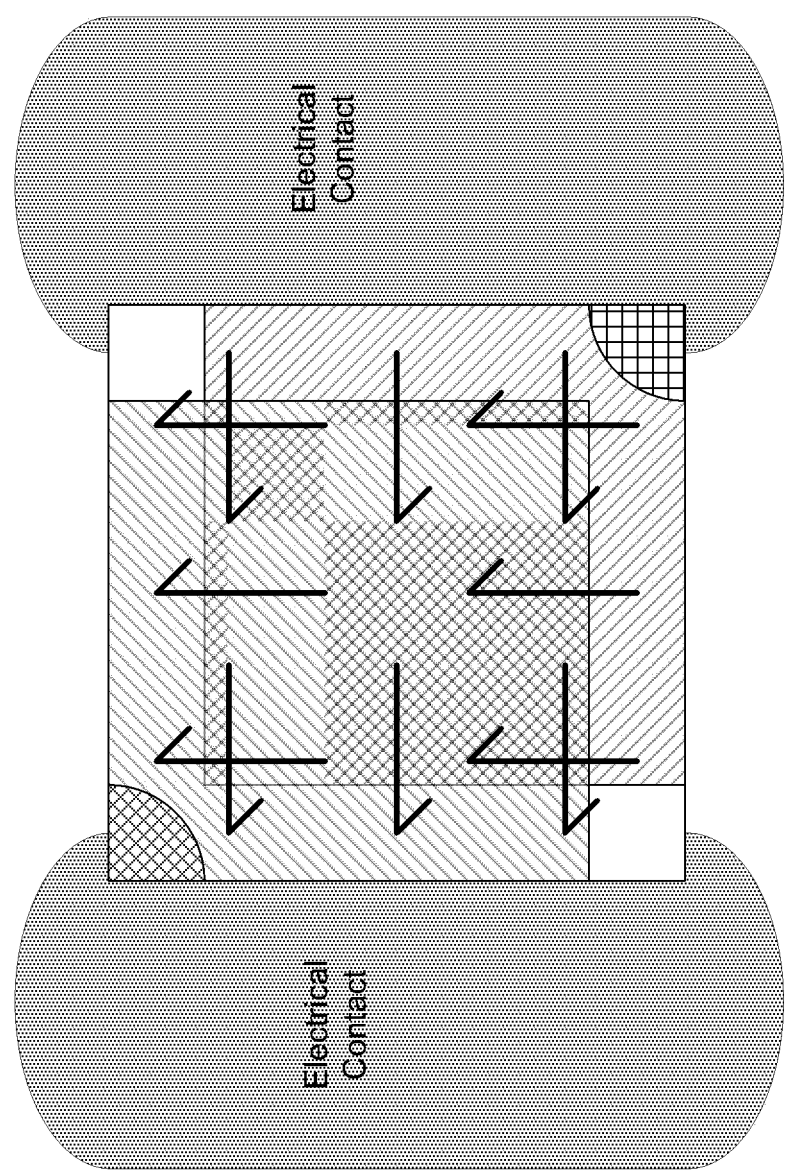
FIGS. 22A and 22B are schematic diagrams showing side and top views, respectively, of the complete TLCL of FIG. 21A with external full side contacts bonded to the device and making electrical contact with the contact areas of the contact structure in accordance with the proposed solution.
Figure 22B:
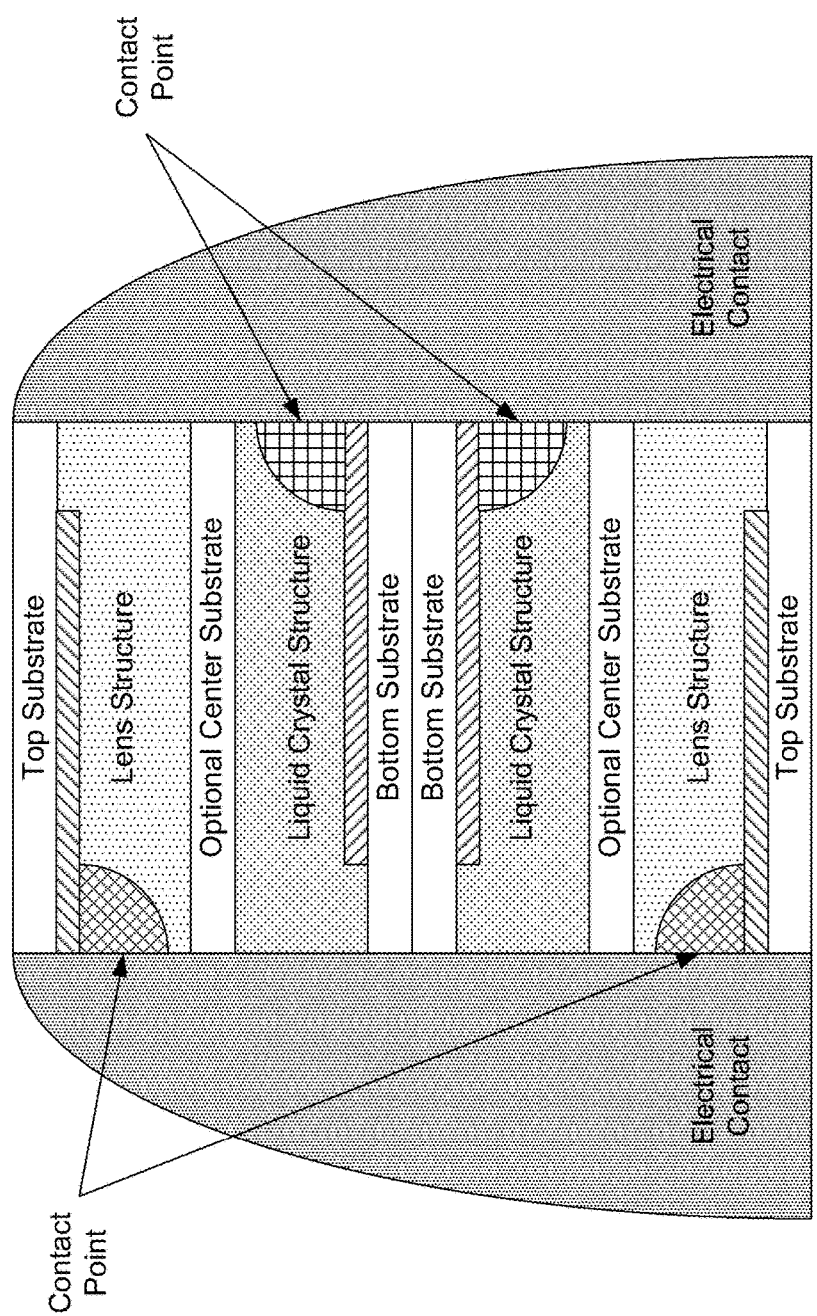

FIGS. 20A and 20B illustrate an improved configuration of a half TLCL which minimizes unwanted electrical contacts. In this configuration, the conducting electrodes layers are patterned such that they extend only to some of the edges of each tunable active optical device. Notably, the electrode layers overlap in plan view over the aperture area of the half TLCL. A complete TLCL formed of two such half TLCLs is shown in FIGS. 21A and 21B, in cross-section and plan view, respectively. Notably, all electrode layers overlap along the optical axis of the full TLCL. As illustrated in FIGS. 22A and 22B, when this complete TLCL is packaged by depositing a mass of conducting material on the sides or corners of the device, the required electrical contacts are reliably made via the remaining edge contact structure without the possibility of shorting the opposite electrodes, since these opposite electrodes do not extend all the way to the respective edge of the device.

Figure 24:
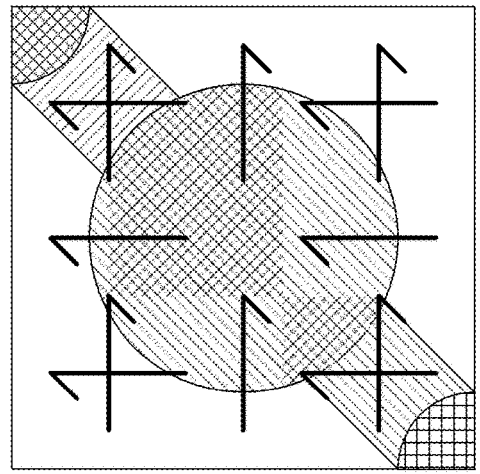
FIGS. 23, 24 and 25, are schematic diagrams illustrating plan views of half TLCL variants with patterned electrodes, where at least two of the edges of the device are free of electrode layer material, in accordance with non-limiting examples of implementation of the present invention.
Figure 23:
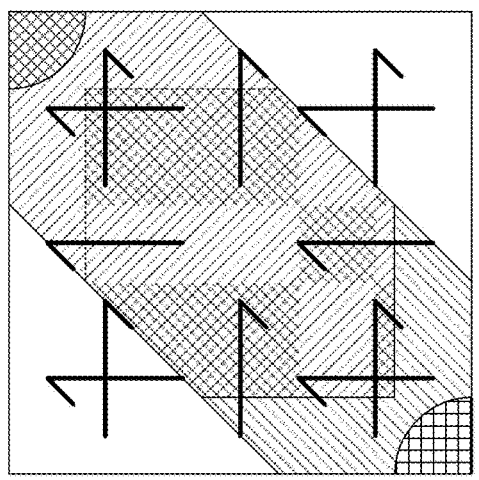
Figure 25:
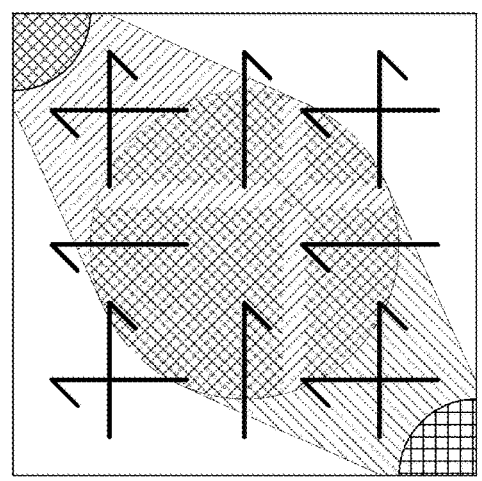

FIGS. 23, 24 and 25 illustrate further examples of possible non-limiting variants of electrode layer patterns that can be used in a half TLCL. In each case, the electrode pattern ensures that at least two of the edges of the device are free of the respective electrode layer material. It should be noted that, although in each of these examples the electrode pattern is shown to be the same for both the LC layer and the lens structure layer, this need not be the case. Although in the foregoing examples the electrode pattern and contact structure would be identical for each TLCL singulated out of a wafer scale array, it is also possible to have different configurations for different TLCLs singulated out of the same wafer (array).

Figure 26A:
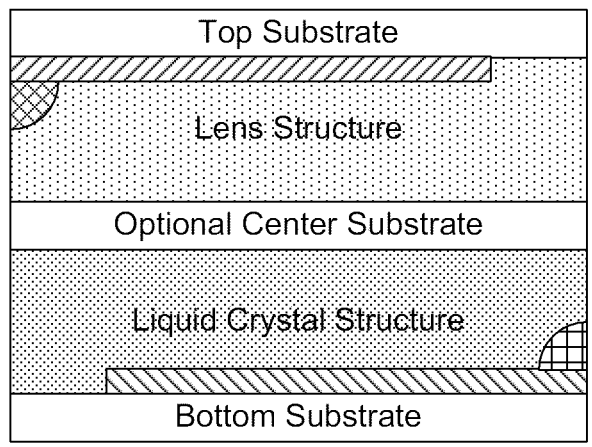
FIGS. 26A and 26B are schematic diagrams showing side and top views, respectively, of one half of a TLCL with a contact structure formed along a side of the device, in accordance with a non-limiting implementation example.
Figure 26B:
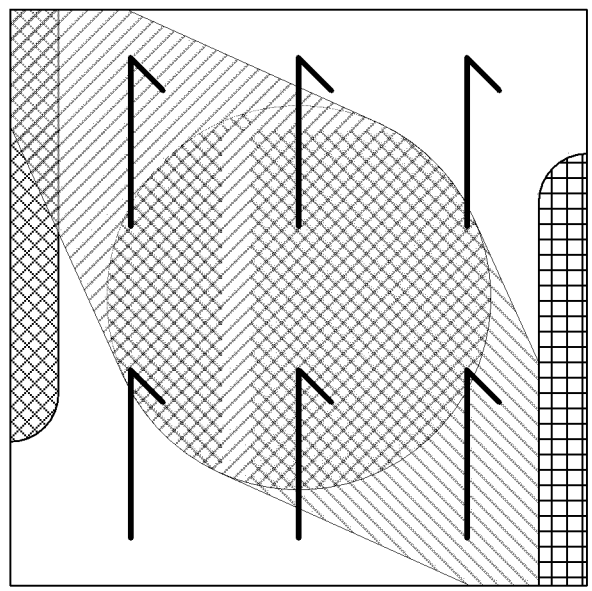
Figure 26C:
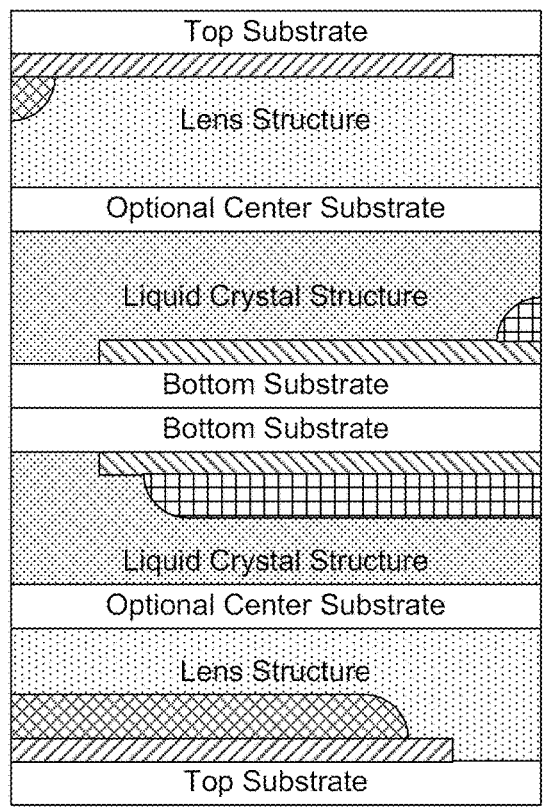
FIGS. 26C and 26D are schematic diagrams showing side and top views, respectively, of a complete TLCL formed by connecting together two half TLCLs of FIG. 26A at their bottom surfaces.
Figure 26D:
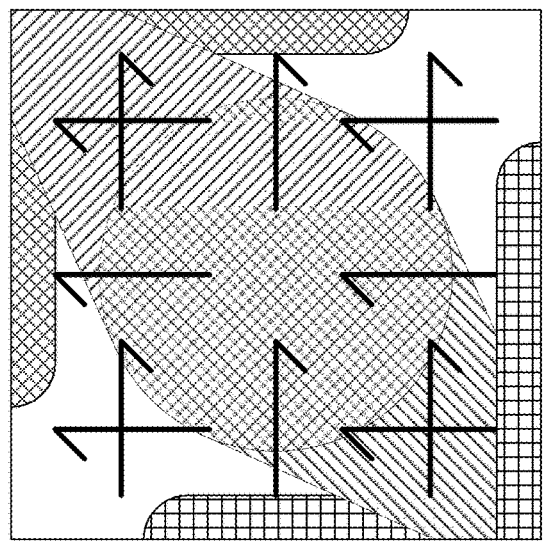

FIGS. 26A to 26D illustrate another non-limiting example of a half TLCL and a corresponding full TLCL configuration, in which the contact structure is not limited to corner beads. As shown, the contact structure of the half TLCL extends down a side of the element/device. Accordingly, in the complete TLCL of FIG. 26C, it can be seen that strips of conducting material of the contact structure are vertically aligned as illustrated in FIG. 26D in one corner of the device. Depending upon the packaging and contact structure layout, the added conducting material need not necessarily overlap.

Figure 27A:
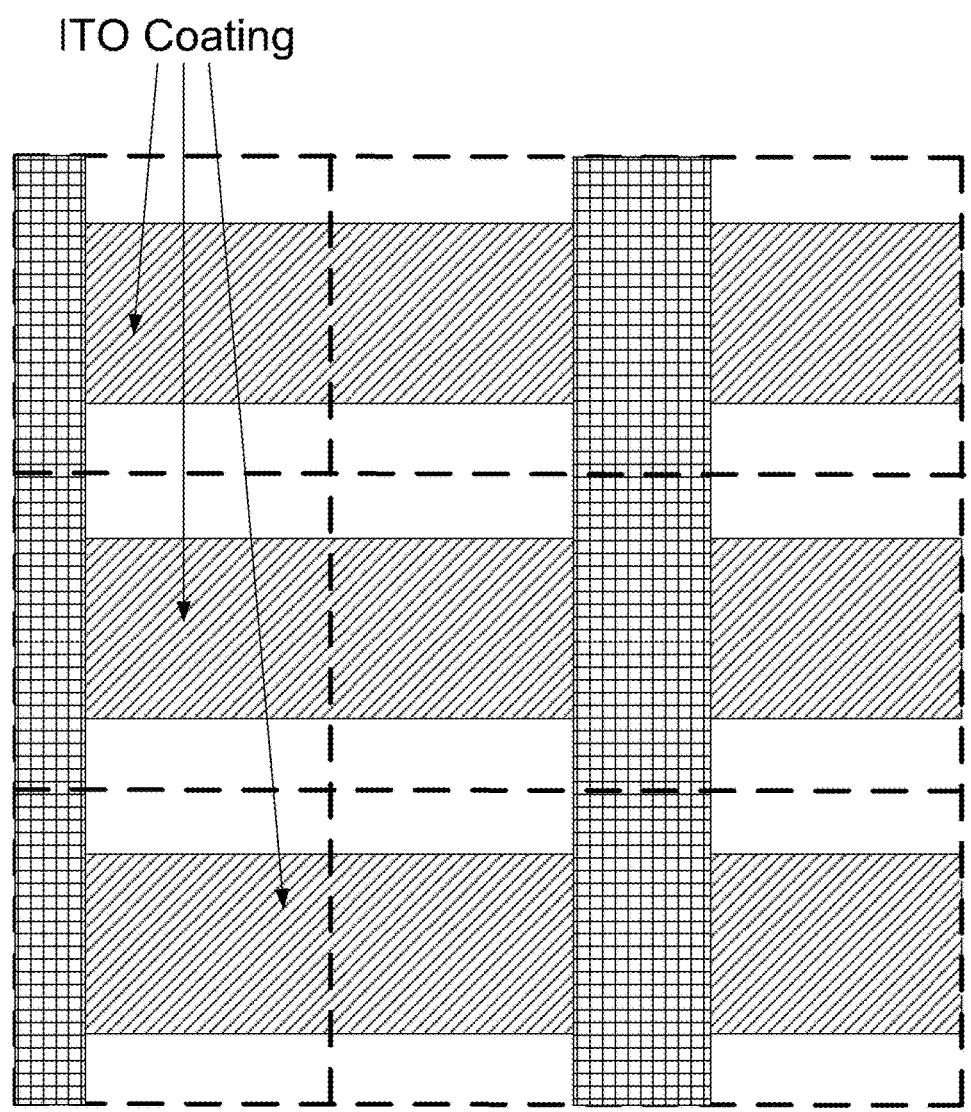
FIG. 27A is a schematic diagrams illustrating strip contact deposition across adjacent electrode layers on a wafer, in accordance with another implementation of the proposed solution.
Figure 27B:
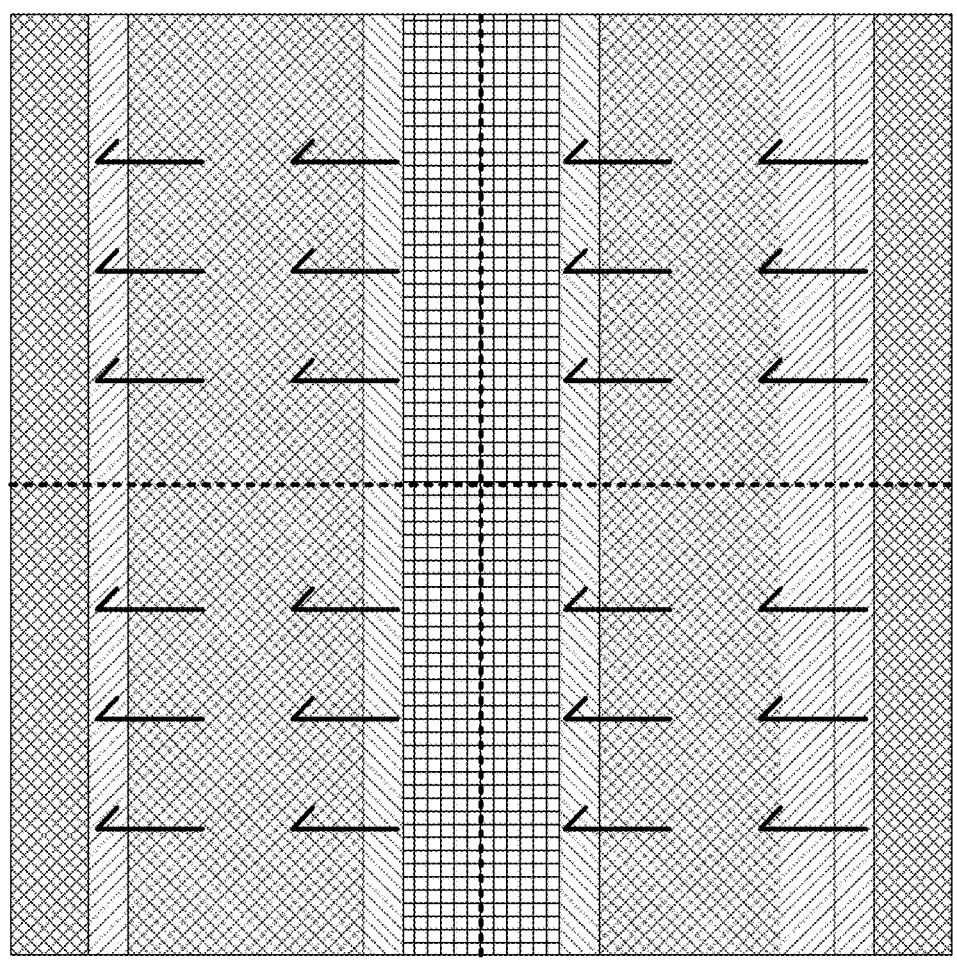
FIGS. 27B to 27D are schematic diagrams illustrating plan and cross-sectional views of a wafer of half TLCLs in accordance with the implementation illustrated in FIG. 27A.
Figure 27C:
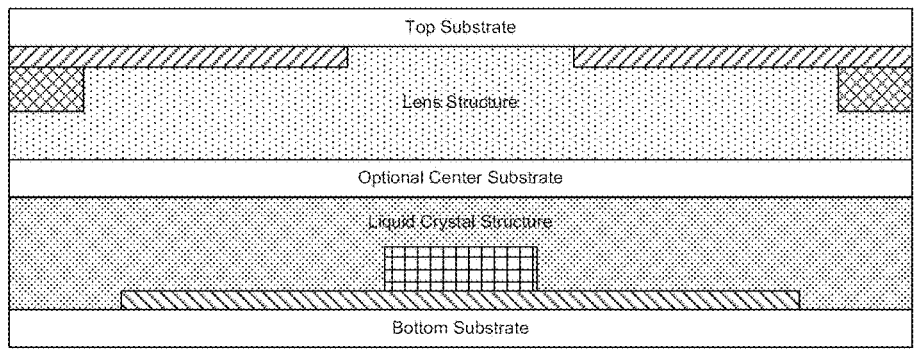
Figure 27D:
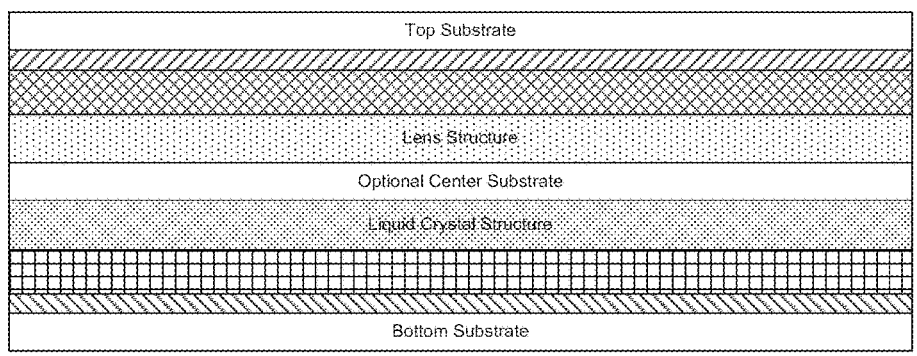

In accordance with a fourth implementation of the second embodiment of the proposed solution, the contact structure is wafer fabricated on patterned electrode layers by depositing contact strips across scribe lines overlapping adjacent element electrode layers. For example metallic contact strips are patterned perpendicular to electrode layer stripes on a wafer as illustrated in FIG. 27A. FIG. 27B illustrates the contact structure of unsingulated half TLCLs viewed in plan view with alternating top and bottom electrode strip contacts. FIG. 27C illustrates an unsingulated half TLCLs in cross-section across the contact strips of the contact structure of FIG. 27B. FIG. 27D illustrates an unsingulated half TLCLs in cross-section along the contact strips of the contact structure of FIG. 27B.

The wafer containing half TLCLs as illustrated in FIGS. 27B to 27D can be subjected to wafer scale testing by driving the half TLCLs from wafer edges employing the contact structure as described herein above.

Figure 27E:
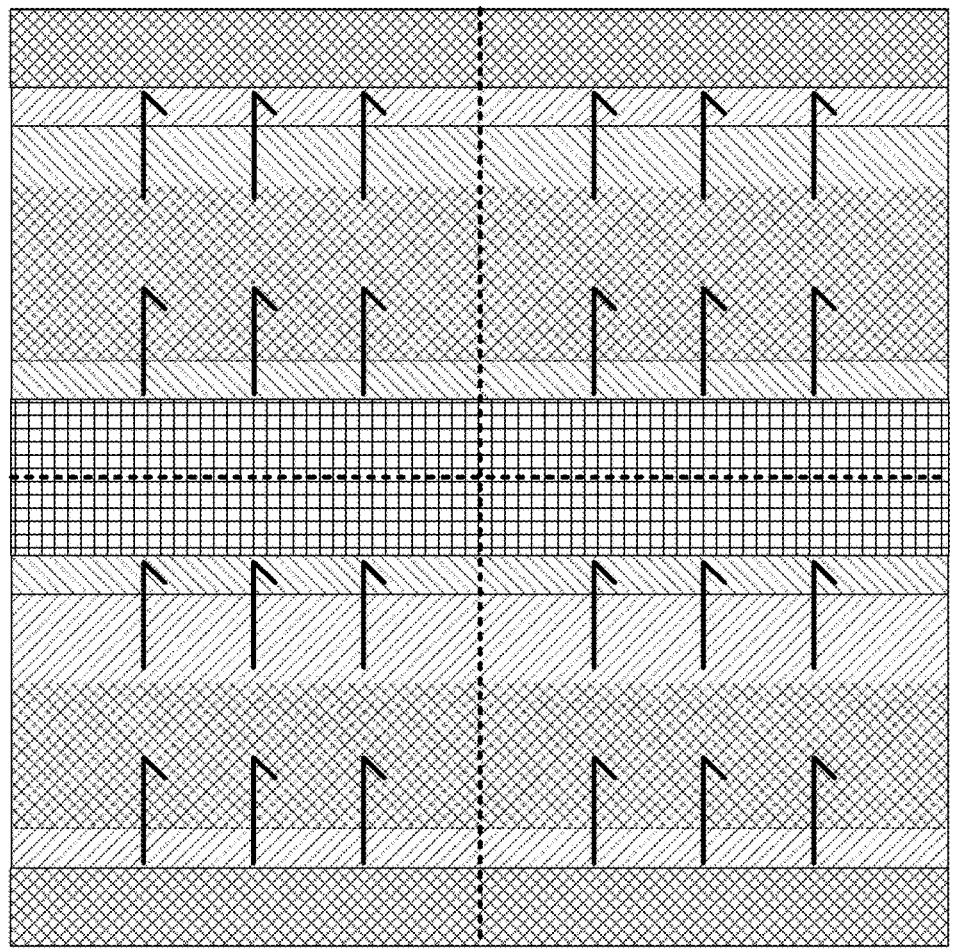
FIGS. 27E and 27F are schematic diagrams illustrating a 90 degree rotated wafer of half TLCLs as illustrated in FIG. 27B and a cross-sectional view of a wafer of full TLCLs, respectively.

FIG. 27E illustrates a second 90 degree rotated wafer containing half TLCLs as shown in FIG. 27B. And, FIG. 27F illustrates a cross-section through a wafer of full TLCLs resulting from bonding the wafer of FIG. 27B with the flipped wafer of FIG. 27E.

Figure 27F:
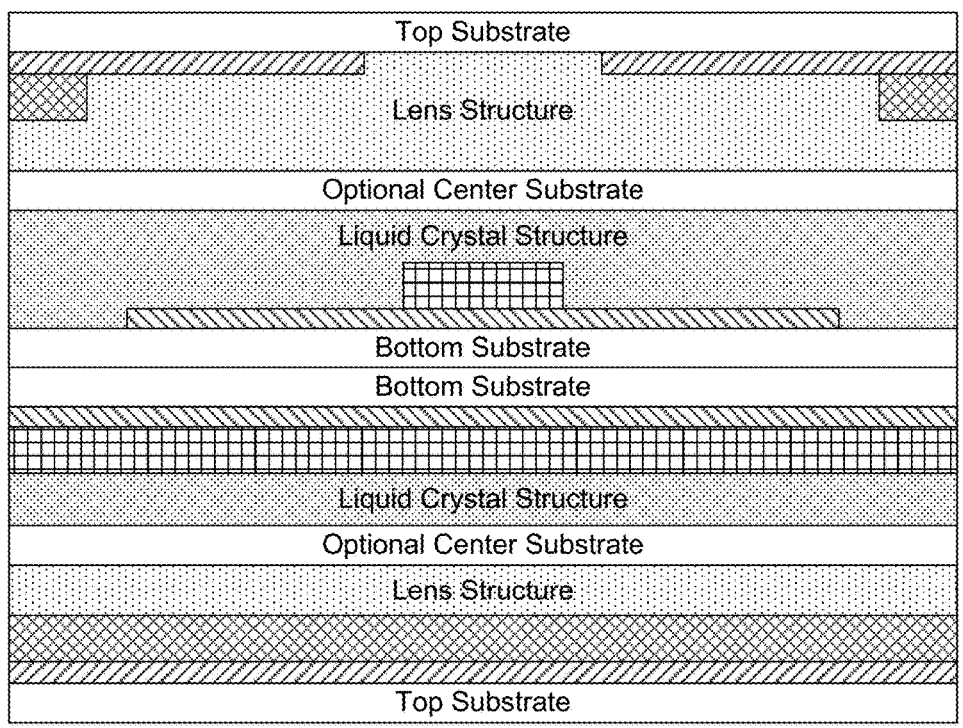

The wafer containing full TLCLs as illustrated in FIG. 27F can be subjected to wafer scale testing by driving the TLCLs from wafer edges employing the contact structure as described herein above. Testing can include providing incident light having one of a random polarization, a circular polarization and a linear polarization aligned with the single polarization of at least one of the half TLCLs in the pair.

For certainty, conductive structures (also referred to herein as contact areas) of the contact structure may be characterized by various different geometric shapes and sizes, without departing from the scope of the present invention. Once the conductive structures of the contact structure have been formed on the electrode layers, fabrication of the TLCL can continue as described above, with the fabrication of the liquid crystal cell, the lens structure, optical element, etc.

It is appreciated that tunable active optical devices, electro-optical liquid crystal devices, tunable liquid crystal lenses, shutter, beam steering devices, etc. have a variety of applications including, but not limited to: space applications, military applications, medical applications, consumer applications, etc. Each application demands different testing regimes. For example, space, military and medical applications may require exhaustive testing of wafer cells at the wafer level and of assembled devices. Exhaustive testing is possible for small runs but can become cost prohibitive for large runs destined for consumer applications. For example, random, pattern and intelligent testing may be suited for consumer grade applications/devices. In accordance with random wafer level testing, wafer cells are driven from the wafer edge in accordance with a random pattern. In accordance with a pattern wafer level testing, wafer cells are driven from wafer edges in individual rows, individual columns, checker patterns, stripped patterns, wafer sections, etc. The operational test results in respect of a number of cells less than the total number of cells on a wafer can be employed in designating all wafer cells as operational. In accordance with intelligent wafer level testing, a small number of cells at specific locations on the wafer are tested, and if identified as operational then all cells on the wafer may be designated as operational. However, if only a limited number of tested cells are identified as operational at some locations while not-operational at other locations, only a corresponding group of cells are designated as operational and the rest rejected. Intelligent wafer level testing may be as conservative as necessary to achieve a cost/fabrication volume balance. In all such implementations, non-operational cells are rejected. Rejection is a process closely related to singulation wherein non-operational designated cells are removed from the fabrication run. For certainty, being designated as operational and being identified as operational are not synonymous. Being identified as operational results from explicit testing. Being designated as operational results from heuristics employed to convert explicit test results into wafer level fabrication decisions. While the rejection process is closely related to singulation, the rejection process is not synonymous with singulation as entire wafer can be rejected from fabrication runs without physical singulation. As well, singulation of a wafer of operational designated cells rejects none.

Figure 28A:
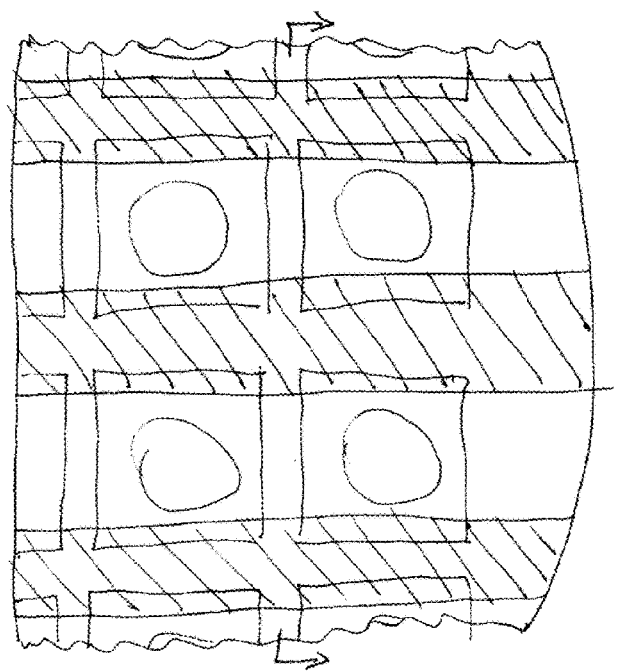
FIGS. 28A and 28B are schematic diagrams illustrating plan and cross-sectional views of a contact structure interconnecting wafer cells and extending to wafer edges in accordance with the proposed solution.
Figure 28B:
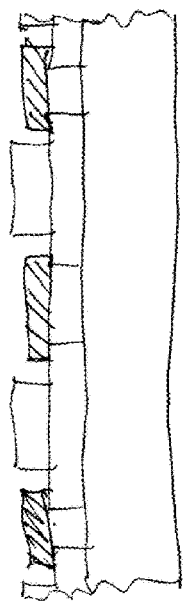

Methods and apparatus described herein provide driving unsingulated wafer cells during fabrication from wafer edges using a contact structure interconnecting multiple cells on a wafer for testing purposes:

It has been discovered that a significant percentage of wafer cells identified as non-operational by direct testing, have failed testing due to insufficient electrical contact between the contact structure and electrode layers. In accordance with the proposed solution, and in particular to reduce rejection rates for space, military and medical applications, care must be exercised with respect to contact structure fabrication on electrode layers. For ease of illustration, in the following description the figures only show parts of the overall contact structure in electrical contact with a single electrode layer with the understanding that the entire contact structure repeats for the other electrode layers of the tunable active optical device, electro-optical liquid crystal device, tunable liquid crystal lens, etc. appropriately flipped, rotated, mirrored, etc. In accordance with the proposed solution the contact structure extends to wafer edges. In particular:

FIGS. 28A and 28B illustrate, in accordance with the proposed solution, a contact structure of redundant parallel contact strips deposited across scribe lines. Either singulation and dicing expose redundant side electrical contact areas along parallel edges of each die. Employing a corresponding second electrode layer contact structure, a small number of wafer cells (4) can be selected for testing.

Figure 29A:
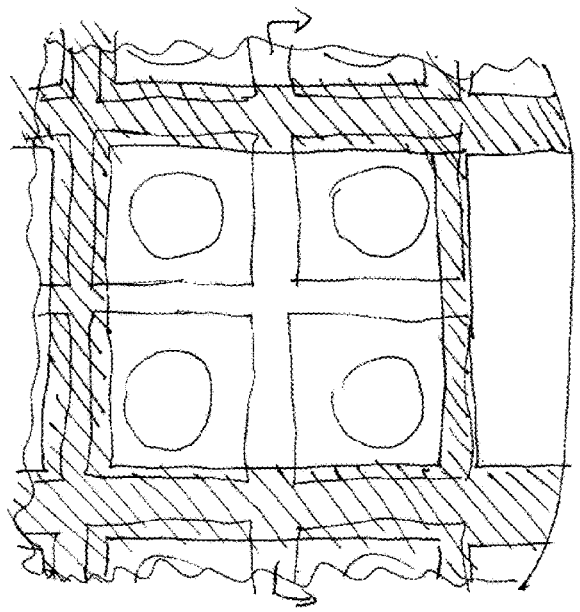
FIGS. 29A and 29B are schematic diagrams illustrating plan and cross-sectional views of another contact structure interconnecting wafer cells and extending to wafer edges in accordance with the proposed solution.
Figure 29B:
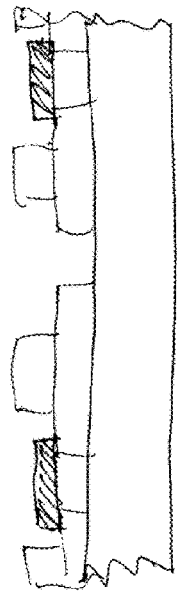

FIGS. 29A and 29B illustrate, in accordance with the proposed solution, another contact structure of redundant contact strips deposited across scribe lines. Either singulation and dicing expose redundant side electrical contact areas along adjacent edges of each die. Employing a similar corresponding second electrode layer contact structure, all wafer cells can be selected for testing. Selection of a smaller number of wafer cells may necessitate a different second electrode contact structure.

Figure 30A:
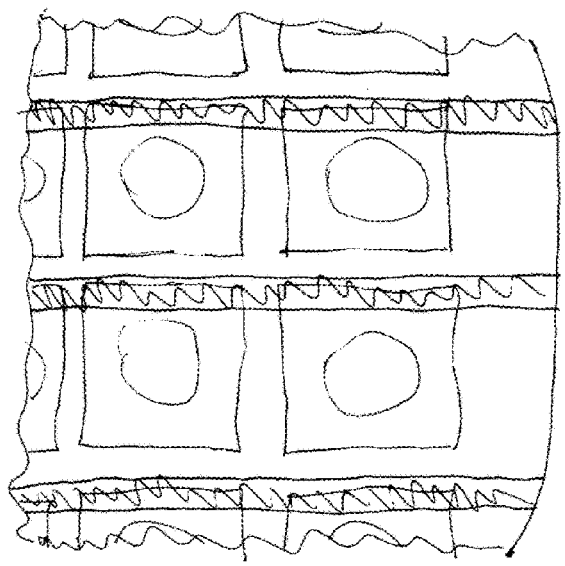
FIGS. 30A and 30B are schematic diagrams illustrating plan and cross-sectional views of a further contact structure interconnecting wafer cells and extending to wafer edges in accordance with the proposed solution.
Figure 30B:
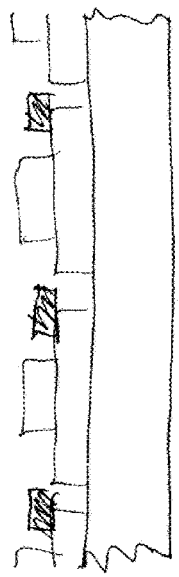

FIGS. 30A and 30B illustrate, in accordance with the proposed solution, a contact structure of parallel contact strips deposited on wafer cell electrode layers. In this implementation the contact strips extend from cell side spaces a distance into the scribe line areas of the wafer however do not extend to adjacent cells. After singulation, an extended electrical contact area may be employed in use however only a reduced contact area is available for testing on the wafer edge during fabrication. The overall contact structure pattern permits driving individual wafer cells for testing during wafer fabrication.

Figure 31A:
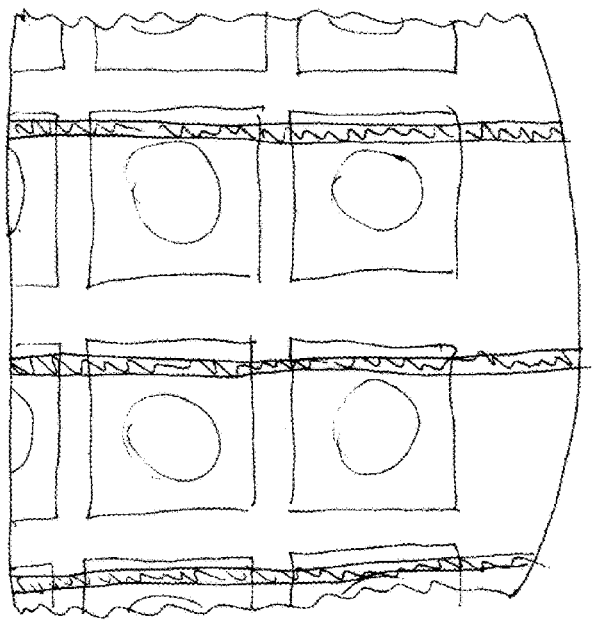
FIGS. 31A and 31B are schematic diagrams illustrating plan and cross-sectional views of a further contact structure interconnecting wafer cells and extending to wafer edges in accordance with the proposed solution.
Figure 31B:
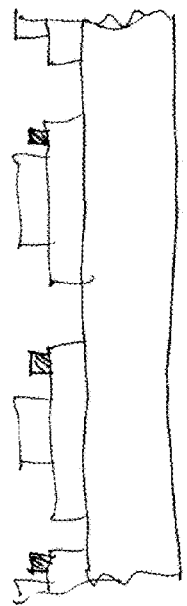
Figure 33A:
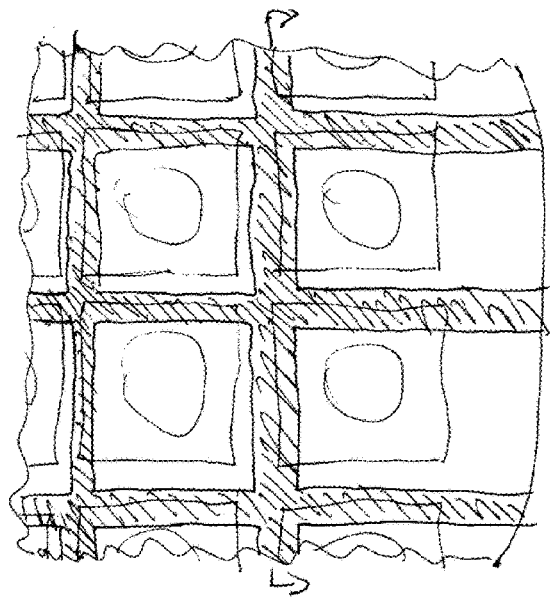
FIGS. 33A and 33B are schematic diagrams illustrating plan and cross-sectional views of a further contact structure interconnecting wafer cells and extending to wafer edges in accordance with the proposed solution.
Figure 33B:
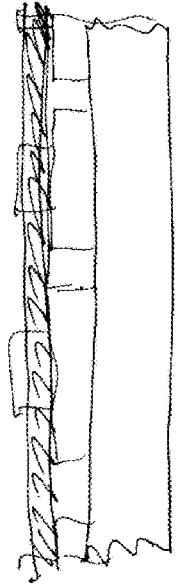
Figure 32A:
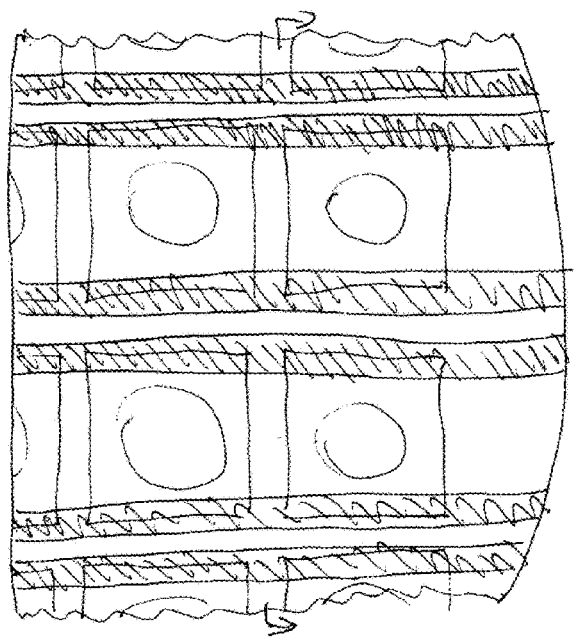
FIGS. 32A and 32B are schematic diagrams illustrating plan and cross-sectional views of a further contact structure interconnecting wafer cells and extending to wafer edges in accordance with the proposed solution.
Figure 32B:
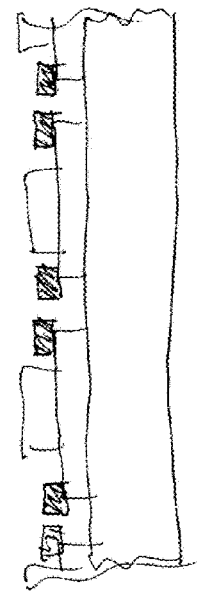
Figure 35A:
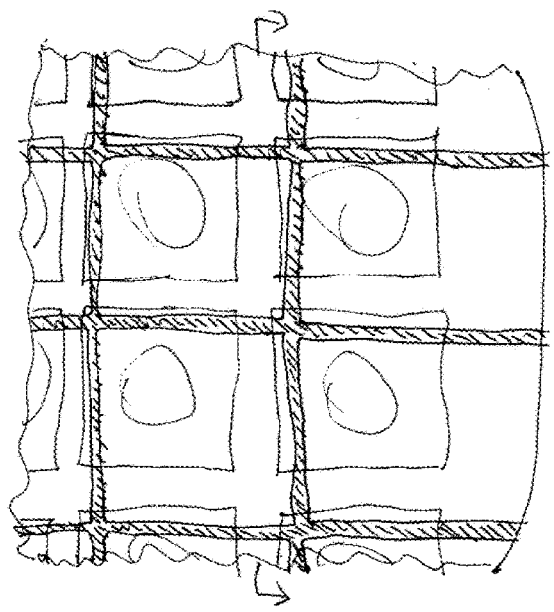
FIGS. 35A and 35B are schematic diagrams illustrating plan and cross-sectional views of a further contact structure interconnecting wafer cells and extending to wafer edges in accordance with the proposed solution.
Figure 35B:
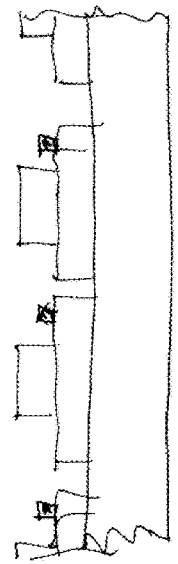
Figure 34A:
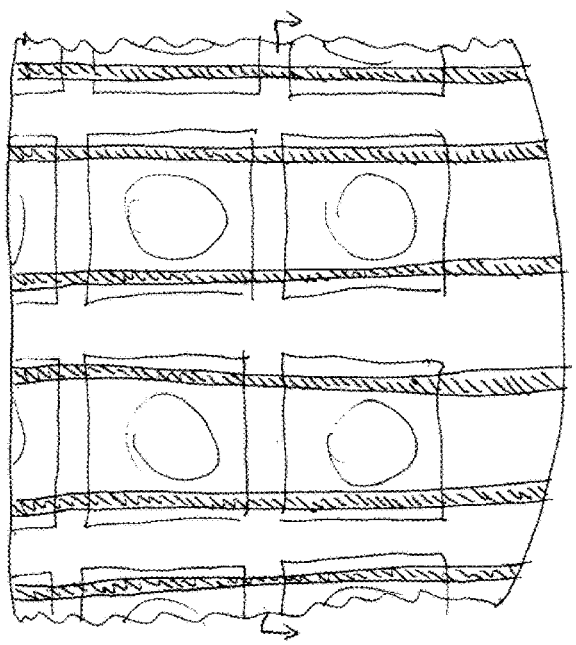
FIGS. 34A and 34B are schematic diagrams illustrating plan and cross-sectional views of a further contact structure interconnecting wafer cells and extending to wafer edges in accordance with the proposed solution.
Figure 34B:
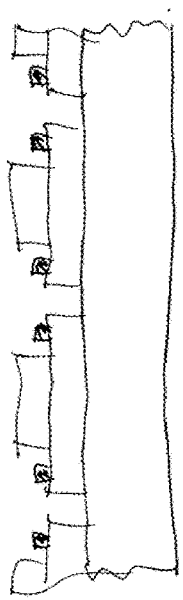

FIGS. 31A and 31B illustrate, in accordance with the proposed solution, a contact structure of parallel contact strips deposited on wafer cell electrode layers. In this implementation the contact strips are within cell side spaces however away from cell edges to which the contact strips are parallel. Only the cross-section of each contact strip on opposite cell sides (redundant) is available for electrical contact in use. In this sense, edge wafer testing better mimics use scenarios. The overall contact structure pattern permits driving individual wafer cells for testing during wafer fabrication.

FIGS. 32A, 32B, 33A and 33B illustrate redundant contact structure employing contact strips of the implementation illustrated in FIGS. 30A and 30B.

FIGS. 34A, 34B, 35A and 35B illustrate redundant contact structure employing contact strips of the implementation illustrated in FIGS. 31A and 31B.

While the invention has be described with reference to half single polarization TLCLs which are rotated to provide full polarization TLCLs, the invention is not limited thereto. In order to define a polarization direction on one wafer the polyimide layer is rubbed along rows on one wafer and along columns on the other mating wafer eliminating the 90 degree turn in making full TLCL structures.

In accordance with the proposed solution, advantages are derived from the provision of bus bar contact strips deposited over electrode layers, and in some implementations extending over the scribe line area between rows/columns of dice on a wafer. For example the width of the bus bar strip contacts can be between 20 to 1000 microns, preferably between 20 to 400 microns. Fabricating a contact structure 20 microns wide provides a good balance between good electrical contacts and layer uniformity requirements. The bus bar strip contacts are used with wafer edge contacts to test wafer cells during wafer fabrication and reused after singulation for die edge contacts in use to drive tunable active optical devices. For example the thickness of the conductive structure can be between 0.5 to 10 microns, preferably between 0.5 to 3 microns. Fabricating a contact structure about 1 microns thick provides a good balance between size reduction and layer uniformity requirements.

While the invention has been shown and described with referenced to preferred embodiments thereof, it will be recognized by those skilled in the art that various changes in form and detail may be made therein without departing from the spirit and scope of the invention as defined by the appended claims.

What is claimed is:

1. An apparatus for testing operation of at least one electro-optical liquid crystal device having at least one driving electrode for operating said device, said apparatus comprising:
   a light source for directing incident light toward said device substantially along an optical axis thereof;
   an electrical arrangement for applying to said liquid crystal device an external electric field to produce a dipolar charge distribution within said electrode, causing operation of said liquid crystal device; and
   an optical sensor responsive to an effect of said liquid crystal operation on said incident light.

2. The apparatus of claim 1, wherein said at least one electro-optical liquid crystal device is included in a multiple unit further including a plurality of such electro-optical devices being tested in parallel using said apparatus.

3. The apparatus according to claim 2, wherein said optical liquid crystal device is one of a tunable-focusing liquid crystal lens and a liquid crystal display cell.

4. The apparatus according to claim 2, further comprising a data processor for analyzing the sensor response to identify any defective portion of said liquid crystal device.

5. The apparatus according to claim 2, wherein said electrical arrangement includes at least one testing electrode connected to an electrical voltage source, said testing electrode being provided on a corresponding substrate.

6. The apparatus according to claim 5, wherein said testing electrode is substantially planar and made of an optically transparent material.

7. The apparatus according to claim 6, wherein each said substrate is made of an optically transparent material.

8. The apparatus according to claim 5, wherein said testing electrode is configured to be disposed in a predetermined spaced relationship with said driving electrode to generate said external electric field at a predetermined voltage value.

9. The apparatus according to claim 8, wherein said device has first and second opposed planar surfaces extending transversely with respect to said optical path, said incident light being directed through one of said first and second surfaces, and said optical effect being sensed from the other one said surfaces.

10. The apparatus according to claim 8, wherein said device has first and second opposed planar surfaces extending transversely with respect to said optical path, said apparatus further comprising an optical reflecting layer disposed adjacent to one of said first and second surfaces, said incident light being directed through the other one of said surfaces, and said optical effect being sensed following reflection thereof on said layer from said adjacent surface through said other surface.

11. The apparatus according to claim 5, wherein said device has first and second driving electrodes disposed in a predetermined spatial relationship with one another, said electrical arrangement including first and second testing electrodes connected to an electrical voltage source.

12. The apparatus according to claim 5, wherein said first testing electrode is provided on a first substrate adapted to be disposed in a predetermined spaced relationship with said first driving electrode, a second testing electrode is provided on a second substrate adapted to be disposed in a predetermined spaced relationship with said second driving electrode, to generate said external electric field at a predetermined relative voltage value between said first and second driving electrodes.

13. The apparatus according to claim 12, wherein said device has first and second opposed planar surfaces extending transversely with respect to said optical path, said incident light being directed respectively through one of said first and second substrates and one of said first and second surfaces, and said optical effect being sensed from the other one of said surfaces through the other one of said substrates.

14. The apparatus according to claim 12, wherein said device has first and second opposed planar surfaces extending transversely with respect to said optical path, said apparatus further comprising an optical reflecting layer disposed adjacent to one of said first and second surfaces, said incident light being directed respectively through one of said first and second substrates and the other one of said surfaces, and said optical effect being sensed following reflection thereof on said layer from said adjacent surface through said other surface and said one of said first and second substrates.

* * * * *